United States Patent
Choi

(10) Patent No.: US 9,754,670 B1
(45) Date of Patent: Sep. 5, 2017

(54) SEMICONDUCTOR DEVICE HAVING SUB-BLOCK STACK STRUCTURES

(71) Applicant: SK hynix Inc., Icheon-si Gyenggi-do (KR)

(72) Inventor: Kang Sik Choi, Seongnam-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/214,833

(22) Filed: Jul. 20, 2016

(30) Foreign Application Priority Data

Feb. 24, 2016 (KR) ........................ 10-2016-0022072

(51) Int. Cl.
| | |
|---|---|
| *G11C 16/10* | (2006.01) |
| *H01L 27/1157* | (2017.01) |
| *H01L 27/11582* | (2017.01) |
| *H01L 27/11573* | (2017.01) |
| *H01L 27/11565* | (2017.01) |
| *H01L 23/522* | (2006.01) |
| *H01L 23/528* | (2006.01) |
| *G11C 16/26* | (2006.01) |
| *G11C 16/04* | (2006.01) |
| *G11C 16/16* | (2006.01) |
| *G11C 16/08* | (2006.01) |

(52) U.S. Cl.
CPC .......... *G11C 16/10* (2013.01); *G11C 16/0483* (2013.01); *G11C 16/08* (2013.01); *G11C 16/16* (2013.01); *G11C 16/26* (2013.01); *H01L 23/528* (2013.01); *H01L 23/5226* (2013.01); *H01L 27/1157* (2013.01); *H01L 27/11565* (2013.01); *H01L 27/11573* (2013.01); *H01L 27/11582* (2013.01)

(58) Field of Classification Search
CPC ..... G11C 16/0483; G11C 16/08; G11C 16/10; G11C 16/16; G11C 16/26; H01L 23/5226; H01L 23/528; H01L 27/11565; H01L 27/1157; H01L 27/11573; H01L 27/11582
See application file for complete search history.

(56) References Cited

U.S. PATENT DOCUMENTS

| | | | | |
|---|---|---|---|---|
| 8,750,044 B2 * | 6/2014 | Choi | ............... | H01L 29/7926 257/324 |
| 8,917,558 B2 * | 12/2014 | Han | ................... | G11C 16/16 365/185.05 |
| 9,378,831 B2 * | 6/2016 | Han | ................... | G11C 16/16 |
| 9,401,216 B1 * | 7/2016 | Yang | ................... | G11C 29/88 |
| 9,502,349 B2 * | 11/2016 | Chen | ............. | H01L 27/11565 |

(Continued)

FOREIGN PATENT DOCUMENTS

| | | |
|---|---|---|
| KR | 1020150006818 A | 1/2015 |
| KR | 1020150060335 A | 6/2015 |

*Primary Examiner* — Vanthu Nguyen
(74) *Attorney, Agent, or Firm* — William Park & Associates Ltd.

(57) ABSTRACT

A semiconductor device includes sub-block stack structures respectively including source layers, where the sub-block stack structures are disposed to be spaced apart from each other along a first direction, a memory block stack structure including word lines stacked over the sub-block stack structures, the word lines being coupled to memory cells, the memory block stack structure extending along the first direction to overlap the sub-block stack structures, and channel layers respectively coupled to the source layers by penetrating the memory block stack structure.

20 Claims, 31 Drawing Sheets

(56) References Cited

U.S. PATENT DOCUMENTS

| | | | |
|---|---|---|---|
| 2013/0270625 A1* | 10/2013 | Jang | H01L 29/7926 257/324 |
| 2015/0325301 A1* | 11/2015 | Nam | G11C 16/0483 365/185.11 |
| 2017/0213843 A1 | 7/2017 | Choi | |

* cited by examiner

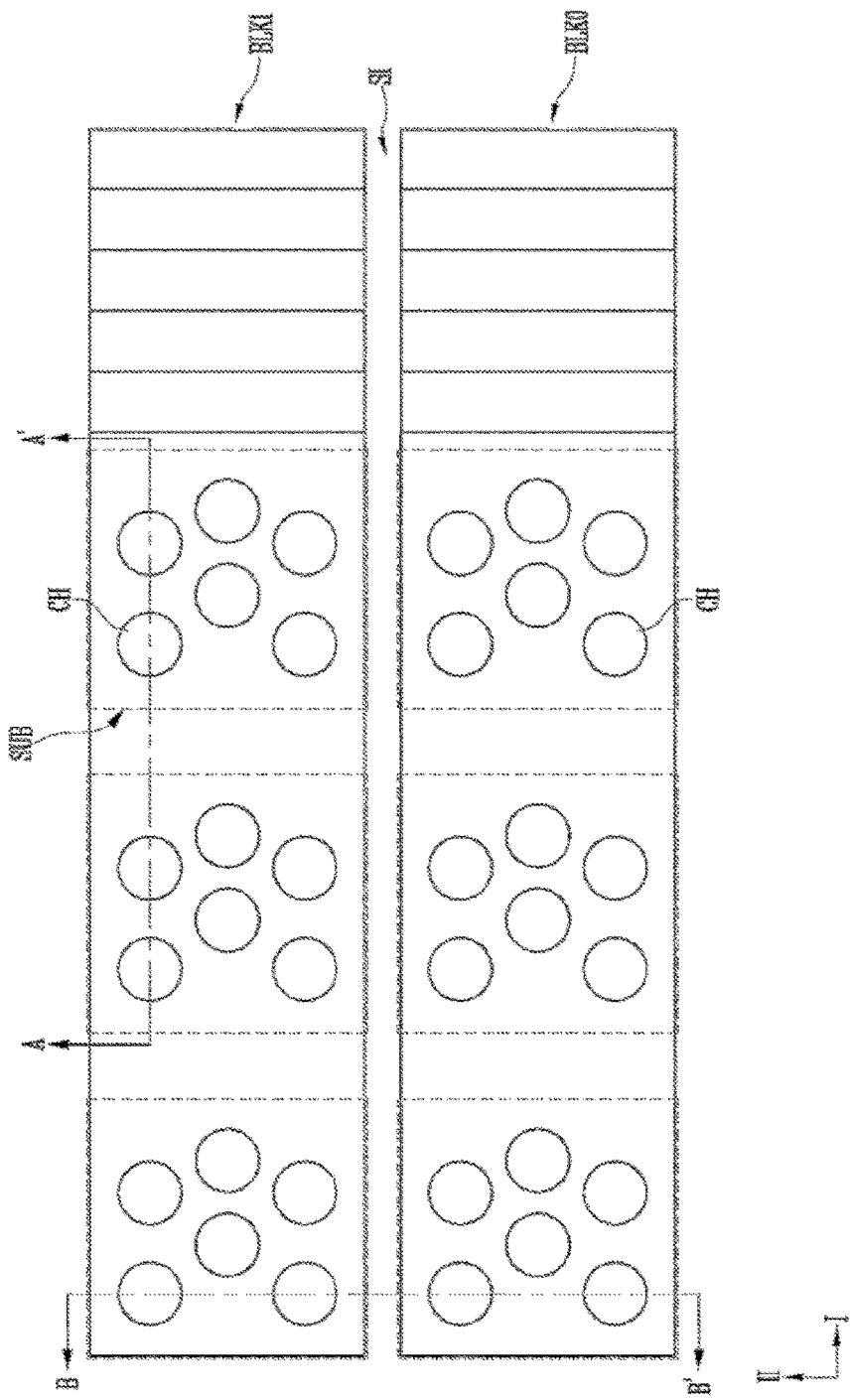

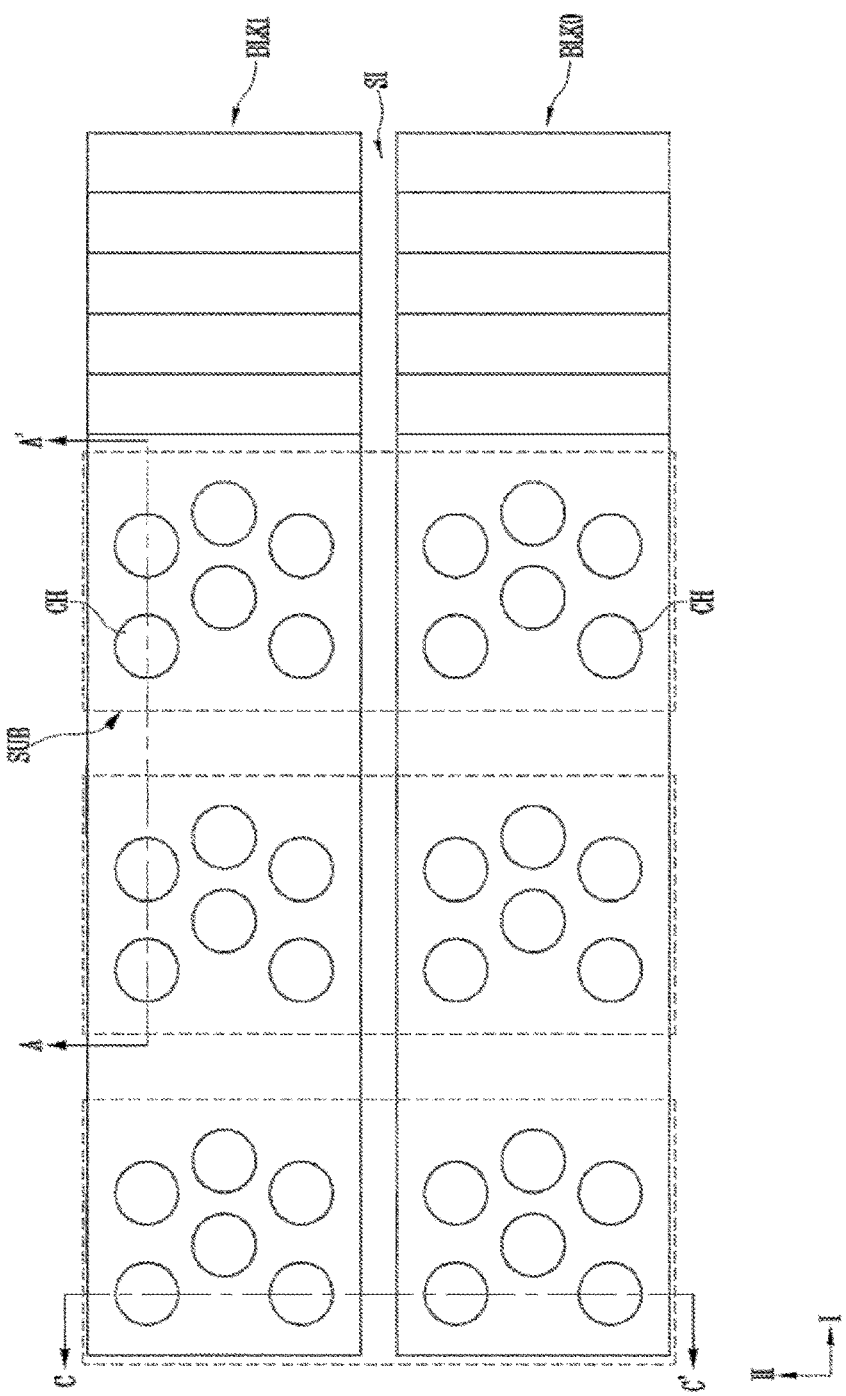

SEMICONDUCTOR DEVICE HAVING SUB-BLOCK STACK STRUCTURES

CROSS-REFERENCE TO RELATED APPLICATION

The present application claims priority under 35 U.S.C. §119(a) to Korean patent application number 10-2016-0022072 filed on Feb. 24, 2016, in the Korean Intellectual Property Office, the entire disclosure of which is incorporated herein by reference.

BACKGROUND

1. Technical Field

An aspect of the present disclosure relates to a semiconductor device, and more particularly, to a three-dimensional semiconductor device.

2. Description of the Related Art

A large number of memory cells should be arranged in a fixed two-dimensional area to achieve a high degree of integration of semiconductor devices. To this end, there has been proposed a three-dimensional semiconductor device having memory cells that are three-dimensionally arranged over a substrate.

The three-dimensional semiconductor device includes a flash memory device. An erase operation of the flash memory device may be performed in memory block units. In a three-dimensional flash memory device, one memory block may include a plurality of memory cells that are three-dimensionally arranged. The number of stacked memory cells may be increased to increase the capacity of the three-dimensional flash memory device. If the number of stacked memory cells is increased, the size of the memory blocks is increased, and the erase size of the memory block is increased. Therefore, the efficiency and reliability of the erase operation may be degraded.

SUMMARY

According to an aspect of the present disclosure, there is provided a semiconductor device including, sub-block stack structures respectively including source layers, where the sub-block stack structures are disposed to be spaced apart from each other along a first direction. The semiconductor device may also include a memory block stack structure including word lines stacked over the sub-block stack structures, the word lines being coupled to memory cells, the memory block stack structure extending along the first direction to overlap with the sub-block stack structures, and channel layers respectively coupled to the source layers by penetrating the memory block stack structure.

According to an aspect of the present disclosure, there is provided a semiconductor device including sub-block stack structures disposed to be spaced apart from each other along a first direction, the sub-block stack structures respectively including source layers extending along a second direction intersecting the first direction. The semiconductor device may also include memory block stack structures extending along the first direction to overlap with the sub-blocks stack structures, the memory block stack structures being disposed to be spaced apart from each other along the second direction, the memory block stack structures respectively including word lines stacked over the sub-block stack structures, the word lines being coupled to memory cells, and channel layers respectively coupled to the source layers by penetrating the memory block stack structures.

BRIEF DESCRIPTION OF THE DRAWINGS

Example embodiments will now be described more fully hereinafter with reference to the accompanying drawings; however, the example embodiments may be embodied in different forms and should not be construed as limited to the embodiments set forth herein. Rather, these embodiments are provided so that this disclosure will be thorough and complete, and will fully convey a scope of the example embodiments to those skilled in the art.

In the drawing figures, dimensions may be exaggerated for clarity of illustration. It will be understood that when an element is referred to as being "between" two elements, the element can be the only element between the two elements, or one or more intervening elements may also be present. Like reference numerals refer to like elements throughout.

FIGS. 4A and 4B are plan views of semiconductor devices according to embodiments of the present disclosure.

DETAILED DESCRIPTION

Hereinafter, exemplary embodiments of the present disclosure will be described in detail with reference to the accompanying drawings. However, the present disclosure is not limited to the embodiments but may be implemented into different forms. These embodiments are provided only for illustrative purposes and for full understanding of the scope of the present disclosure by those skilled in the art. Further, the scope of the present disclosure should be understood within the scope of the present disclosure defined by the appended claims.

Embodiments provide for a semiconductor device which can improve the operation efficiency and reliability of a memory block.

Figure 1:
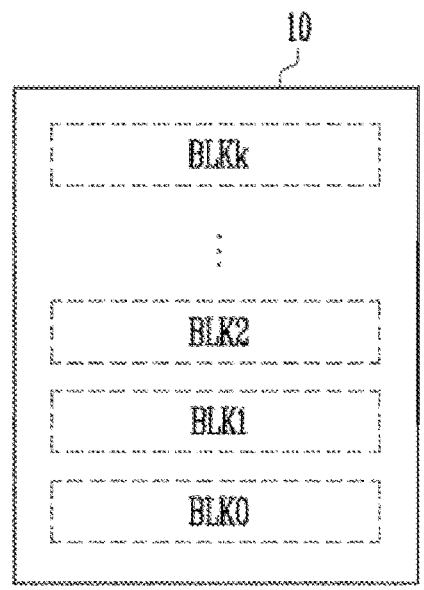
FIG. 1 is a block diagram of a semiconductor device according to an embodiment of the present disclosure.

FIG. 1 is a block diagram of a semiconductor device according to an embodiment of the present disclosure.

Referring to FIG. 1, the semiconductor device according to an embodiment may include a cell array 10 including a plurality of memory block stack structures BLK0 to BLKk.

The memory block stack structures BLK0 to BLKk may be coupled to a plurality of cell strings. The plurality of cell strings may be divided into memory blocks that can be individually selected according to a block select signal. The memory block stack structures BLK0 to BLKk may be divided into memory block units. Each of the memory blocks may be divided into a plurality of sub-blocks. In the following description, the memory block stack structures BLK0 to BLKk are defined as structures separated into memory block units, and sub-block stack structures are defined as structures separated into sub-block units further segmented than the memory blocks.

Figure 2A:
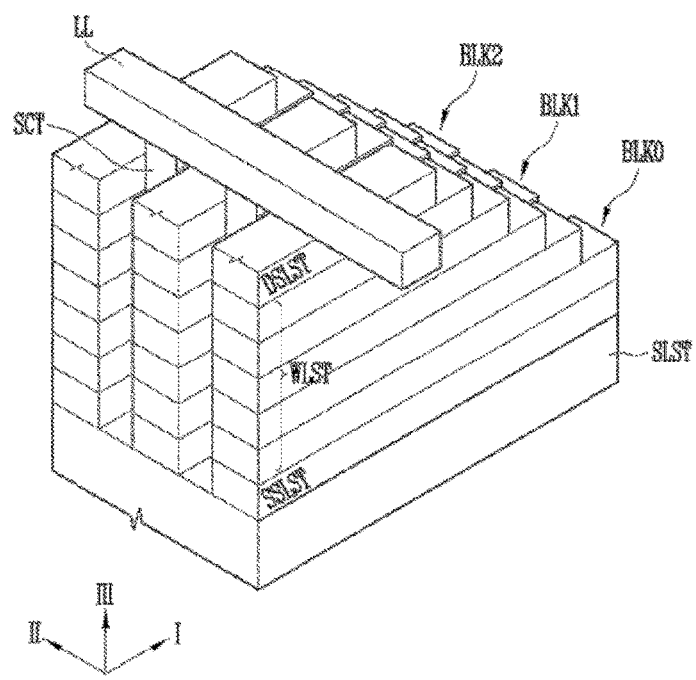
FIGS. 2A and 2B are views illustrating an example of memory block stack structures and a source layer in a semiconductor device according to an embodiment of the present disclosure.
Figure 2B:
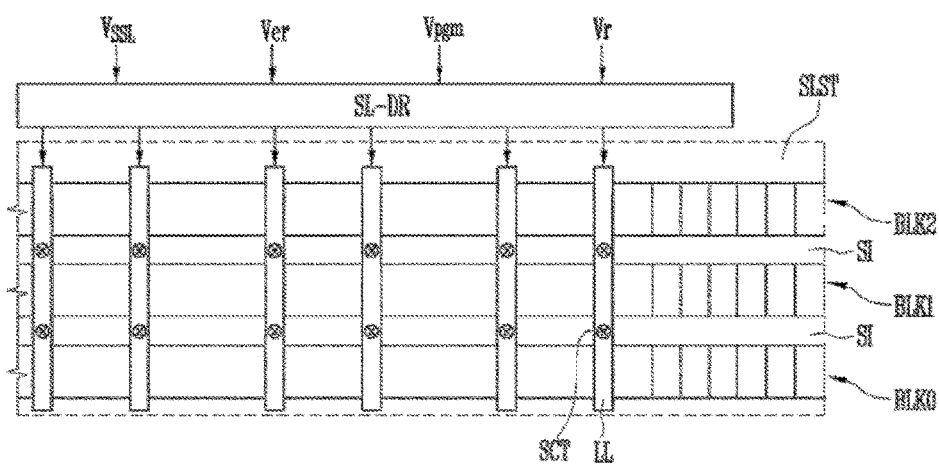

FIGS. 2A and 2B are views illustrating an example of memory block stack structures and a source layer in a semiconductor device. More specifically, FIG. 2A is a perspective view of the semiconductor device, and FIG. 2B is a plan view of the semiconductor device.

Referring to FIGS. 2A and 2B, the semiconductor device may include a plurality of memory block stack structures BLK0, BLK1, and BLK2 separated by slits SI. Each of the memory block stack structures BLK0, BLK1, and BLK2 may extend along a first direction I. Each of the memory block stack structures BLK0, BLK1, and BLK2 may include a source select stack structure SSLST, a word line stack structure WLST, and a drain select stack structure DSLST, which are stacked to form a step structure.

A source layer stack structure SLST may be disposed to overlap the plurality of memory block stack structures BLK0, BLK1, and BLK2 under the plurality of memory block stack structures BLK0, BLK1, and BLK2. The source layer stack structure SLST may be formed to be wider than the memory block stack structures BLK0, BLK1, and BLK2. The source layer stack structure SLST may include a contact region exposed by the slit SI. The contact region of the source layer stack structure SLST may be coupled to a plurality of source contact plugs SCT. The plurality of source contact plugs SCT may be coupled to a routing line LL extending along a second direction II intersecting the first direction I, to transmit operation voltages VSSL, Ver, Vpgm, and Vr from a source drive circuit SL_DR to the source layer stack structure SLST.

The source contact plugs SCT may extend along a third direction III that is a stacking direction of the source select stack structure SSLST, the word line stack structure WLST, and the drain select stack structure DSLST. The routing line LL is disposed on the source contact plugs SCT, and may extend toward the source drive circuit SL_DR.

According to the above-described structure, when an access program, erase, or read operation is performed on a selected memory block, it is difficult to control cell strings in a unit smaller than a memory block. The following embodiments of the present disclosure include semiconductor devices in which cell strings can be controlled in sub-block units further segmented to be smaller than memory blocks.

Figure 3:
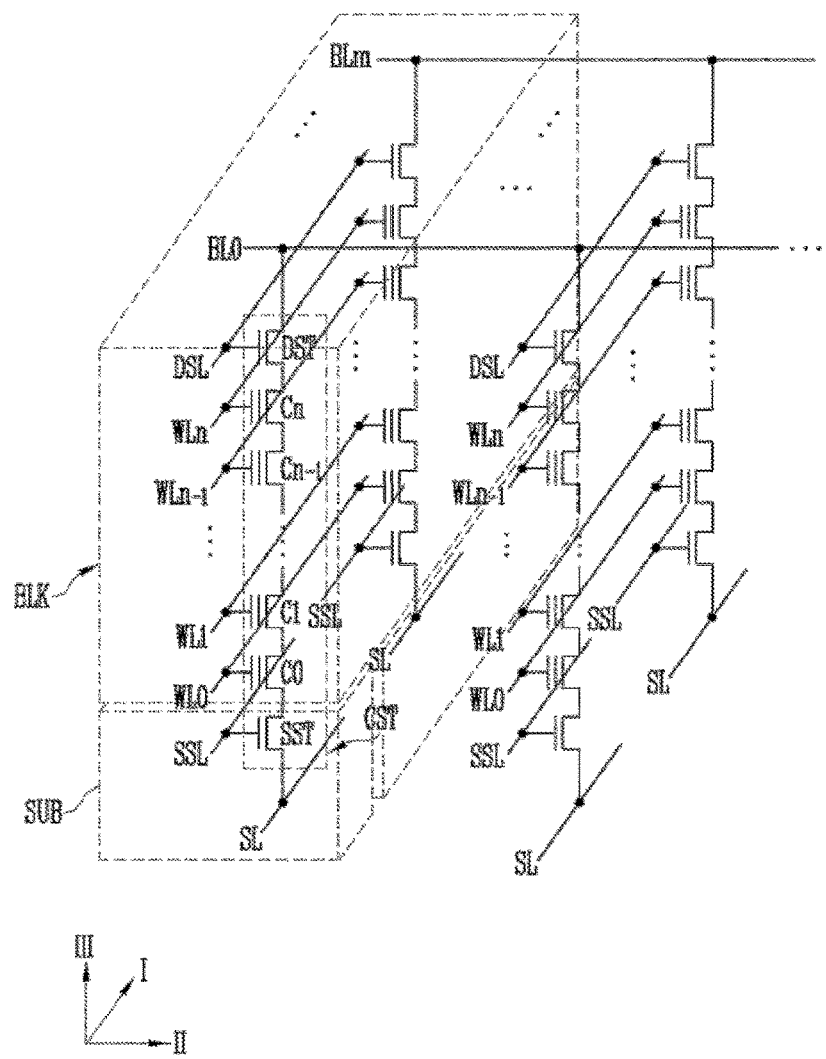
FIG. 3 is a circuit diagram of a semiconductor device according to an embodiment of the present disclosure.

FIG. 3 is a circuit diagram of a semiconductor device according to an embodiment of the present disclosure.

Referring to FIG. 3, the semiconductor device according to an embodiment of the present disclosure includes a plurality of cell strings CST. Each of the cell strings CST may include a drain select transistor DST, memory cells C0 to Cn, and a source select transistor SST, which are arranged along a third direction III. The drain select transistor DST, the memory cells C0 to Cn, and the source select transistor SST may be coupled in series through a channel layer.

Gates of the memory cells C0 to Cn are coupled to word lines WL0 to WLn stacked between bit lines BL0 to BLm and a source layer SL. The memory cells C0 to Cn are controlled by a voltage applied to the word lines WL0 to WLn.

The source select transistor SST includes a gate coupled to a source select layer SSL, and is controlled by a voltage applied to the source select layer SSL. The source select transistor SST controls coupling and decoupling between a cell string corresponding source select transistor SST and the source layer SL. The source select layer SSL is disposed under the word lines WL0 to WLn and over the source layer SL.

The drain select transistor DST includes a gate coupled to a drain select line DSL, and is controlled by a voltage applied to the drain select line DSL. The drain select transistor DST controls coupling and decoupling between a memory string corresponding to the drain select transistor DST and a bit line (e.g., BL0) also corresponding to the drain select transistor DST. The drain select line DSL may be disposed on the word lines WL0 to WLn and under the bit lines BL0 to BLm, wherein at least one drain select line DSL may be coupled to at least one drain select transistor DST.

The word lines WL0 to WLn and the drain select line DSL may extend along a first direction I. Each of the word lines WL0 to WLn and the drain select line DSL may be coupled to two or more cell strings CST. The number of cell strings CST respectively coupled to the word lines WL0 to WLn and the drain select line DSL may be variously changed depending on designs. The word lines WL0 to WLn and the drain select line DSL may constitute a memory block stack structure BLK. The memory block stack structure BLK may extend along the first direction I that is an extending direction of the word lines WL0 to WLn and the drain select line DSL.

The bit lines BL0 to BLm may extend along a second direction II intersecting the first direction I. Two or more cell strings CST may be coupled to each of the bit lines BL0 to BLm. The number of cell strings CST coupled to each of the bit lines BL0 to BLm may be variously changed depending on designs.

The source select layer SSL and the source layer SL may be disposed under the memory block stack structure BLK to constitute a sub-block stack structure SUB. A plurality of sub-block stack structures SUB to be spaced apart from each other along the first direction I, may be disposed under the memory block stack structure BLK including word lines WL. The source select layer SSL and the source layer SL may be separated in units of the sub-block stack structures SUB. The number of cell strings CST coupled to each source select layer SSL and source layer SL may be smaller than the number of cell strings CST coupled to each of the word lines WL0 to WLn and the drain select line DSL. That is, the number of cell strings CST coupled to each sub-block stack structure SUB may be smaller than the number of cell strings CST coupled to the memory block stack structure BLK. The number of cell strings CST coupled to each source select layer SSL and source layer SL may variously change depending on designs.

The memory block stack structures BLK may be stacked over the sub-block stack structures SUB. Each sub-block stack structure SUB may be formed with a narrower area than the memory block stack structure BLK such that the entire area of the sub-block stack structure SUB may be overlapped by the memory block stack structure BLK. Alternatively, the sub-block stack structure SUB may extend along the second direction II to overlap a plurality of memory block stack structures BLK disposed to be spaced apart from each other along the second direction II.

As described above, in an embodiment of the present disclosure, a plurality of segmented source layers SL and source select layers SSL are disposed under the memory block stack structure BLK. Thus, the source layers SL and the source select layers SSL can be controlled in sub-block units which may be further segmented memory blocks.

FIGS. 4A and 4B are plan views of semiconductor devices according to embodiments of the present disclosure. More specifically, each of FIGS. 4A and 4B illustrates at least one end portion of memory blocks of the semiconductor devices.

Referring to FIGS. 4A and 4B, each of the semiconductor devices according to embodiments of the present disclosure may include a plurality of memory block stack structures BLK0 and BLK1 separated by a slit SI. The memory block stack structures BLK0 and BLK1 may extend along a first direction I. The memory block stack structures BLK0 and BLK1 may be spaced apart from each other along a second direction II intersecting the first direction I.

Each of the semiconductor devices according to embodiments of the present disclosure may include channel layers CH penetrating each of the memory block stack structures BLK0 and BLK1. The channel layers CH may be disposed in a zigzag form along the first and second directions I and II to be densely disposed inside each of the memory block stack structures BLK0 and BLK1. When the channel layers CH are disposed in this manner, a degree of integration of memory cells can be improved.

Each of the semiconductor devices according to embodiments of the present disclosure may include a plurality of sub-block stack structures SUB overlapping the memory block stack structures BLK0 and BLK1. The sub-block stack structures SUB may be disposed to be spaced apart from each other along the first direction I.

As shown in FIG. 4A, the sub-block stack structures SUB may be separated by a sub-insulating structure including a portion extending in the same direction as the slit SI. Accordingly, the sub-block stack structures SUB may also be disposed to be spaced apart from each other along the second direction II intersecting the first direction I, and can be separated into memory block units. According to this separation structure of the sub-block stack structures SUB, the sub-block stack structures SUB can be disposed in a matrix form along the first and second directions I and II.

Alternatively, as shown in FIG. 4B, the sub-block stack structures SUB may extend to intersect the slit SI. That is, the sub-block stack structures SUB may extend along the second direction II. Accordingly, each of the sub-block stack structures SUB can commonly overlap the memory block stack structures BLK0 and BLK1. The memory block stack structures BLK0 and BLK1 may be disposed to be spaced apart from each other along the second direction II and the sub-block stack structures SUB may be disposed to be spaced apart from each other along the first direction I.

The channel layer CH shown in FIGS. 4A and 4B extend to penetrate portions of the sub-block stack structures SUB, and may contact a source layer of the sub-block stack structures SUB.

Hereinafter, a vertical structure of the memory block stack structures BLK0 and BLK1, the channel layers CH, and the sub-block stack structures SUB will be described with reference to FIGS. 5A to 5C.

Figure 5A:
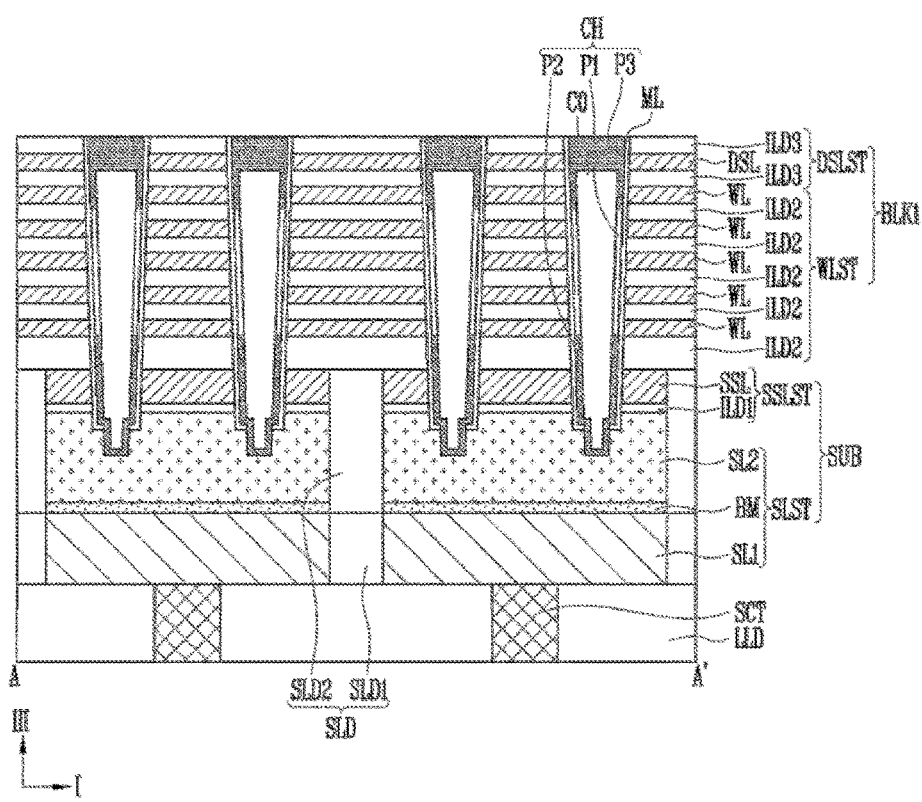
FIGS. 5A to 5C are sectional views of the semiconductor devices shown in FIGS. 4A and 4B.
Figure 5B:
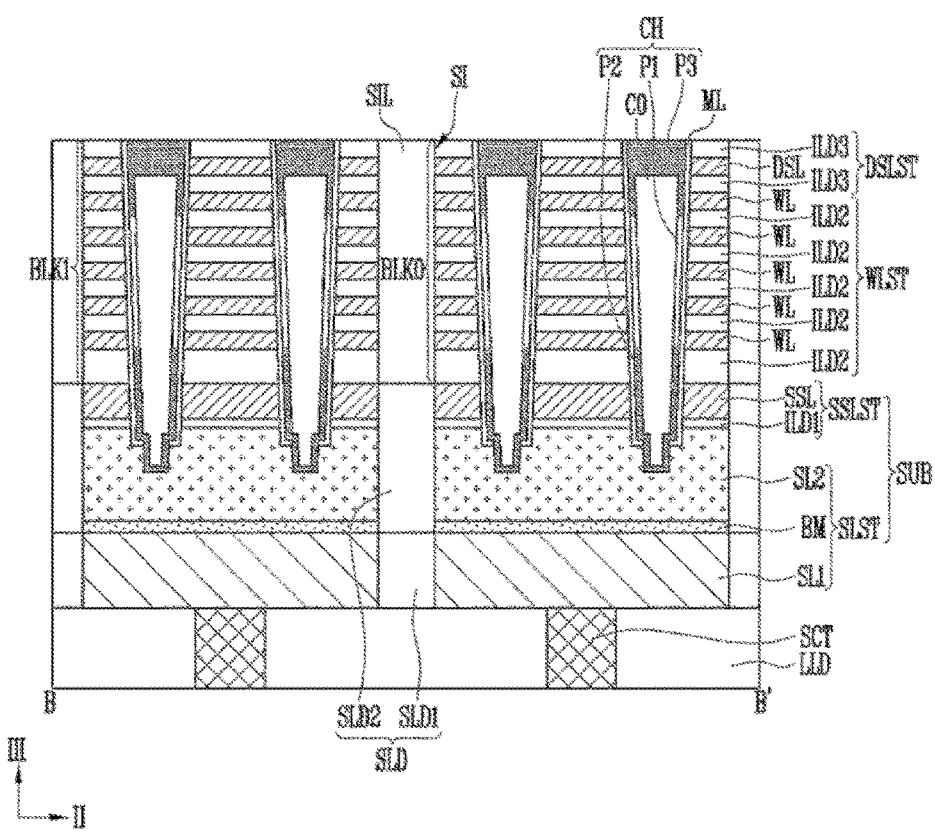
Figure 5C:
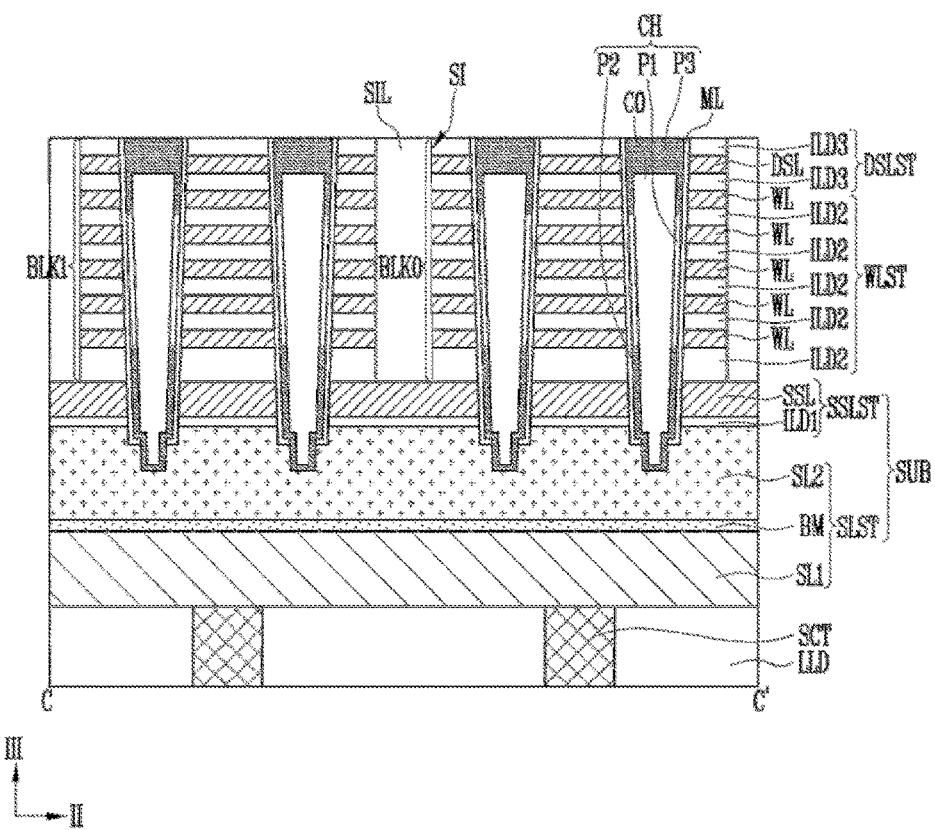

FIGS. 5A to 5C are sectional views of the semiconductor devices shown in FIGS. 4A and 4B. More specifically, FIG. 5A is a sectional view taken along the line A-A' shown in FIG. 4A or 4B. More specifically, FIG. 5B is a sectional view taken along the line B-B' shown in FIG. 4A. FIG. 5C is a sectional view taken along the line C-C' shown in FIG. 4B.

Referring to FIGS. 5A to 5C, the sub-block stack structures SUB may include source layer stack structures SLST and source select stack structures SSLST, respectively. The source select stack structures SSLST may be stacked on the source layer stack structures SLST, respectively. The sub-block stack structures SUB may be separated by a sub-insulating structure SLD.

The sub-insulating structure SLD may be formed into a stack structure of a first sub-insulating layer SLD1 and a second sub-insulating layer SLD2. In order to separate the sub-block stack structures SUB as shown in FIG. 4A, the sub-insulating structure SLD may extend along the first and second directions I and II to form a mesh type. In this case, a portion of the sub-insulating structure SLD, as shown in FIG. 5B, may overlap the slit SI and a slit insulating layer SIL filled in the slit SI to extend along the same direction as the slit SI and the slit insulating layer SIL. Alternatively, in order to separate the sub-block stack structures SUB as shown in FIG. 4B, the sub-insulating structure SLD may extend along the second direction II and be separated into a plurality of patterns along the first direction I. In this case, a portion of the slit SI or a portion of the slit insulating layer SIL, as shown in FIG. 5C, may overlap the sub-block stack structures SUB.

Each of the source layer stack structures SLST may include source layers SL1 and SL2 each stacked in one or more layers. For example, each of the source layer stack structures SLST may include a first source layer SL1 and a second source layer SL2 stacked on the first source layer SL1. The first source layer SL1 may be formed of a metal layer so as to reduce resistance of the source layer stack structures SLST. For example, the first source layer SL1 may include tungsten. The second source layer SL2 may include a doped silicon layer capable of supplying a dopant. Each of the source layer stack structures SLST may further include a barrier metal layer BM disposed between the first and second source layers SL1 and SL2 so as to prevent diffusion of metal.

Each of the source select stack structures SSLST may include a first interlayer insulating layer ILD1 and a source select layer SSL, which are alternately stacked. The first interlayer insulating layer ILD1 and the source select layer SSL may be alternately stacked in one or more layers. The source select layer SSL may be formed of a conductive material including silicon, metal silicide, metal, etc.

The first source layer SL1 may be separated into a plurality of sub-patterns by the first sub-insulating layer SLD1. Each of the barrier metal layer BM, the second source layer SL2, the first interlayer insulating layer ILD1, and the source select layer SSL may be separated into a plurality of sub-patterns by the second sub-insulating layer SLD2.

The memory block stack structures BLK0 and BLK1 may be separated by the slit SI and the slit insulating layer SIL. Each of the memory block stack structures BLK0 and BLK1 may include a word line stack structure WLST and a drain select stack structure DSLST.

The word line stack structure WLST may be disposed on the source select stack structure SSLST. The word line stack structure WLST may include second interlayer insulating layers ILD2 and word lines WL, which are alternately stacked in two layers or more. The word lines WL may be formed of a conductive material including silicon, metal silicide, metal, etc. Each of the word lines WL and the second interlayer insulating layers ILD2 may be separated into a plurality of memory block patterns by the slit SI and the slit insulating layer SIL.

The drain select stack structure DSLST may be disposed on the word line stack structure WLST. The drain select stack structure DSLST may include third interlayer insulating layers ILD3 and a drain select line DSL, which are alternately stacked in one layer or more. The drain select line DSL may be formed of a conductive layer including silicon, metal silicide, metal, etc. Each of the third interlayer insulating layers ILD3 and the drain select line DSL may be separated into a plurality of memory block patterns by the slit SI and the slit insulating layer SIL.

Each of the channel layers CH may include first to third regions P1 to P3 surrounding a core insulating layer C0. Each of the channel layers CH may be formed of a semiconductor layer including a silicon layer, etc. The first region P1 of each of the channel layers CH may be an undoped region, or the first region P1 may be a first doped region including a dopant of a first concentration. The second region P2 of each of the channel layers CH may be a second doped region including a dopant of a second concentration higher than the concentration of the dopant of the first region P1. The second region P2 may be used as a source junction. The third region P3 of each of the channel layers CH may be a third doped region including a dopant of a third concentration higher than the concentration of the dopant of the first region P1. The third region P3 may be used as a drain junction.

The channel layers CH may penetrate the memory block stack structures BLK0 and BLK1 including the drain select line DSL and the word lines WL to be coupled to the source layer stack structures SLST. Particularly, the channel layers CH may penetrate the source select layers SSL to contact the second source layers SL2 of the source layer stack structures SLST, to be supplied with a dopant from the second source layers SL2.

Although not shown in these figures, each of the channel layers CH may be configured as an undoped region.

Sidewalls of the channel layers may be surrounded by multi-layered memory layers ML, respectively. Each of the multi-layered memory layers ML may include a tunnel insulating layer contacted with the sidewall of the channel layer CH, a data storage layer surrounding the tunnel insulating layer, and a blocking insulating layer surrounding the data storage layer. The tunnel insulating layer may include a silicon oxide layer through which charges can tunnel. The data storage layer may include a silicon nitride layer in which charges can be trapped. Alternately, the data storage layer may include a phase change material, a ferroelectric material, a nano-dot, etc. The blocking insulating layer may include an insulating material by which charges can be blocked.

The multi-layered memory layers ML are disposed between the source select layers SSL of the source layer stack structures SLST and the channel layers CH to surround the channel layers CH, respectively, and the multi-layered memory layers ML may extend along sidewalls of the memory block stack structures BLK0 and BLK1 facing the channel layers CH.

Each of the semiconductor devices according to embodiments of the present disclosure may further include source contact plugs SCT disposed under the source layer stack structures SLST. The source contact plugs SCT may contact the source layer stack structures SLST, respectively. Although not shown in these figures, peripheral circuits for driving memory blocks may be disposed under the sub-block stack structures SUB. Particularly, sub-block drive circuits as some of the peripheral circuits may be disposed under the sub-block stack structures SUB. The source contact plugs SCT may be formed by penetrating a lower insulating layer LLD. The lower insulating layer LLD covers the peripheral circuits (not shown), and may be disposed under the source layer stack structures SLST. The source contact plugs SCT may be formed to electrically couple the sub-block drive circuits (not shown) to the source layer stack structures SLST. Hereinafter, vertical positioning of the sub-block drive circuits will be described with reference to FIG. 6.

Figure 6:
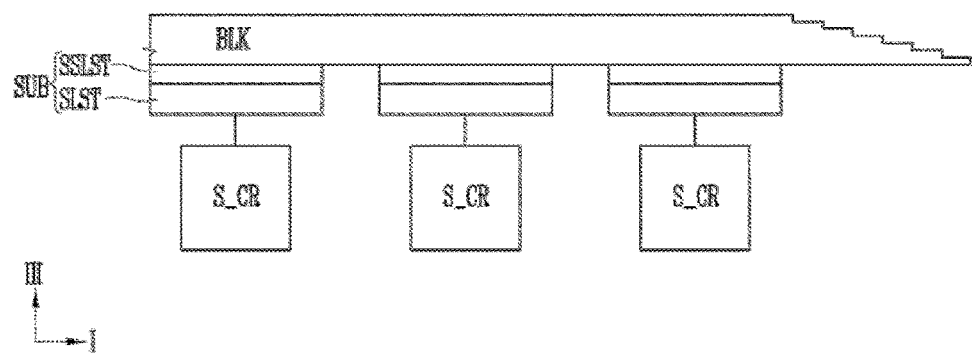
FIG. 6 is a sectional view schematically illustrating a vertical arrangement of a memory block stack structure, sub-block stack structures, and sub-block drive circuits according to an embodiment of the present disclosure.

FIG. 6 is a sectional view schematically illustrating a vertical arrangement of a memory block stack structure, sub-block stack structures, and sub-block drive circuits according to an embodiment of the present disclosure.

Referring to FIG. 6, sub-block stack structures SUB each formed into a stack structure of a source layer stack structure SLST and a source select stack structure SSLST may be arranged to be spaced apart from each other along a first direction I. A memory block stack structure BLK may be disposed on the sub-block stack structures SUB. The memory block stack structure BLK may extend along the first direction I to overlap the plurality of sub-block stack structures SUB arranged to be spaced apart from each other along the first direction I. An end portion of the memory block stack structure BLK is patterned in a step structure to be used as a contact region.

Sub-clock drive circuits S_CR may be disposed under the sub-block stack structures SUB, respectively. The sub-block drive circuits S_CR may individually provide operation voltages to the sub-block stack structures SUB. The sub-block drive circuits S_CR may be disposed under the sub-block stack structures SUB to overlap the sub-block stack structures SUB and the memory block stack structure BLK, or sub-block drive circuits S_CR may alternatively be disposed lower than the sub-block stack structures SUB but does not overlap the sub-block stack structures SUB or the memory block stack structure BLK. An overlapping relationship between the sub-block drive circuits S_CR and the memory block stack structure BLK and an overlapping relationship between the sub-block drive circuits S_CR and the sub-block stack structures SUB will be described later with reference to FIGS. 8A to 8D.

The sub-block drive circuits S_CR may generate operation voltages and provide the generated operation voltages to the respective sub-block stack structures SUB, or may transmit operation voltages which may be externally generated from an external device to the respective sub-block stack structures SUB.

Figure 7A:
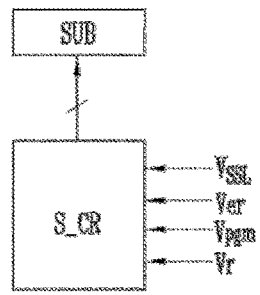
FIGS. 7A and 7B are diagrams illustrating sub-block drive circuits according to various embodiments of the present disclosure.
Figure 7B:
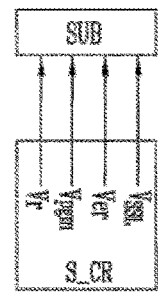

FIGS. 7A and 7B are diagrams illustrating sub-block drive circuits according to various embodiments of the present disclosure.

Referring to FIGS. 7A and 7B, each of the sub-block drive circuits S_CR may provide various operation voltages VSSL, Ver, Vpgm, and Vr to a sub-block stack structure SUB corresponding thereto. The operation voltages may include a source select gate voltage VSSL supplied to a source select layer, an erase voltage Ver supplied to a source layer stack structure, a program voltage Vpgm, and a read voltage Vr. The level of the source select gate voltage VSSL may be varied to perform erase, program, and read operations. The erase voltage Ver may be provided to the source layer stack structure in the erase operation, the program voltage Vpgm may be provided to the source layer stack structure in the program operation, and the read voltage Vr may be provided to the source layer stack structure in the read operation.

As shown in FIG. 7A, the sub-block drive circuit S_CR may be configured with pass transistors that transmit operation voltages VSSL, Ver, Vpgm, and Vr to the sub-block stack structure SUB. The operation voltages VSSL, Ver, Vpgm, and Vr may be externally generated from an external device (e.g., a voltage generator).

Alternatively, as shown in FIG. 7B, the sub-block drive circuit S_CR may be configured to generate operation voltages VSSL, Ver, Vpgm, and Vr and to provide the generated operation voltages VSSL, Ver, Vpgm, and Vr to the sub-block stack structure SUB.

FIGS. 8A to 8D are layout diagrams illustrating semiconductor devices according to various embodiments of the present disclosure.

Referring to FIGS. 8A to 8D, memory block stack structures BLK0 to BLKk may individually receive signals provided through word line drive circuits WL_DR. The word line drive circuits WL_DR may individually provide memory block operation voltages for each of the memory block stack structures BLK0 to BLKk.

Sub-block stack structures SUB may be arranged under the memory block stack structures BLK0 to BLKk to be spaced apart from each other along the extending direction of the memory block stack structures BLK0 to BLKk. The sub-block stack structures SUB may individually receive operation voltages VSSL, Ver, Vpgm, and Vr provided through sub-block drive circuits S_CR. Accordingly, each of the semiconductor devices according to the embodiment of the present disclosure can apply signals to source select layers and source layers of the sub-block stack structures SUB in sub-block units further segmented than memory blocks. Thus, each of the semiconductor devices according to the embodiments of the present disclosure can control a size for an operation of each memory block to be divided into sub-block units. As a result, in the embodiments of the present disclosure, it is possible to increase the speed of an access operation including an erase operation, a program operation, etc. Further, it is possible to improve the efficiency of the access operation.

Figure 8A:
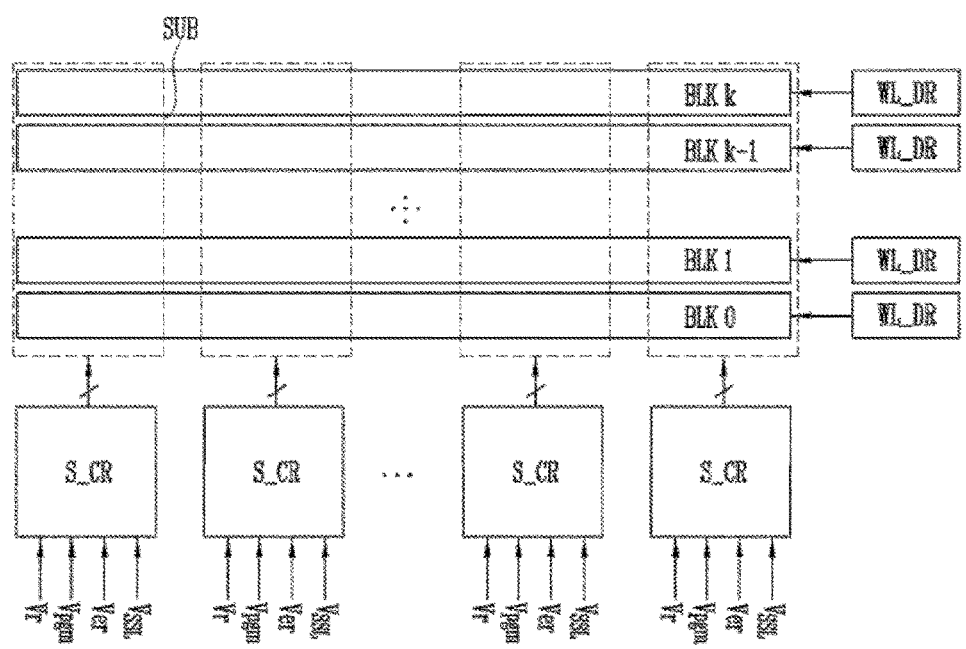
FIGS. 8A to 8D are layout diagrams illustrating semiconductor devices according to various embodiments of the present disclosure.
Figure 8B:
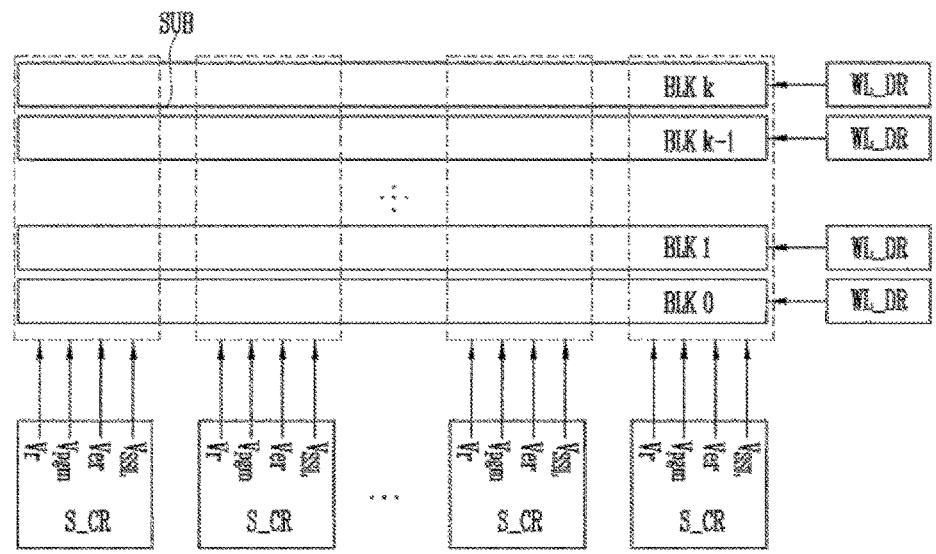
Figure 8C:
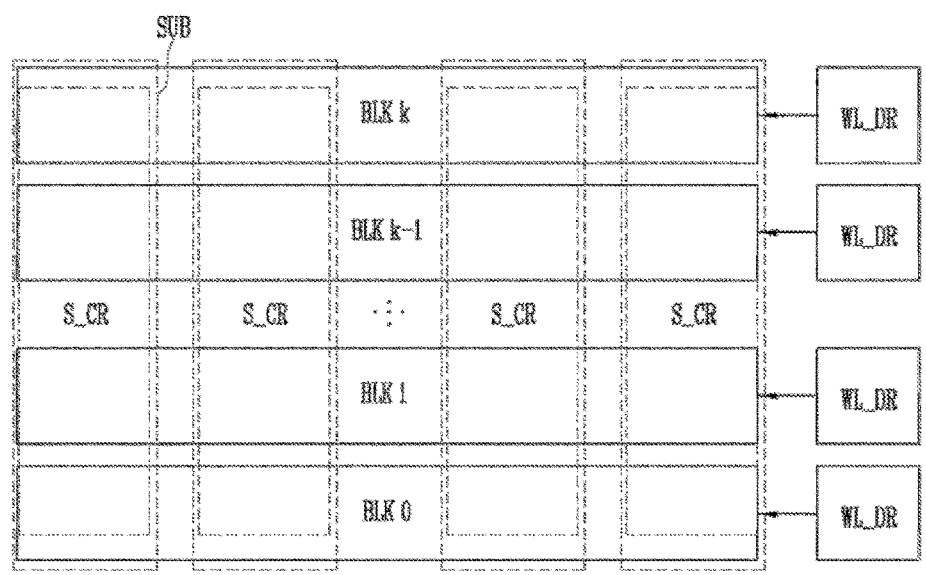

Referring to FIGS. 8A to 8C, the sub-block stack structures SUB may extend along a direction intersecting the memory block stack structures BLK0 to BLKk. Accordingly, each of the sub-block stack structures SUB can overlap the plurality of memory block stack structures BLK0 to BLKk. In this case, the sub-block drive circuits S_CR may be arranged to not overlap the sub-block stack structures SUB and the memory block stack structures BLK0 to BLKk as shown in FIGS. 8A and 8B, or may be arranged to respectively overlap the sub-block stack structures SUB as shown in FIG. 8C.

Figure 8D:
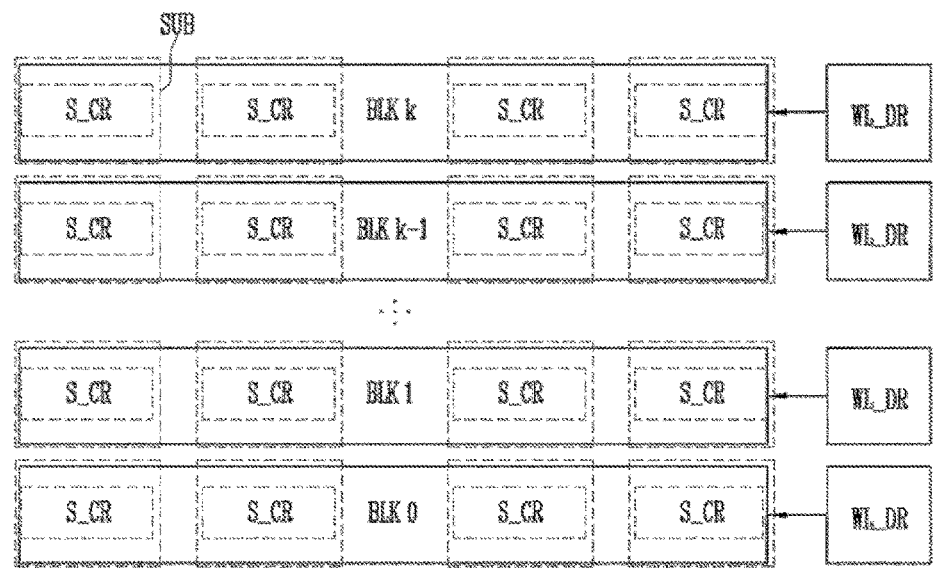

Referring to FIG. 8D, the sub-block stack structures SUB may be arranged to be spaced apart from each other along a direction intersecting the memory block stack structures BLK0 to BLKk. In this case, the sub-block stack structures SUB may overlap the memory block stack structures BLK0 to BLKk without getting out of the two-dimensional area in which the memory block stack structures BLK0 to BLKk are arranged. The sub-block drive circuits S_CR may be arranged to respectively overlap the sub-block stack structures SUB arranged in a matrix form as shown in FIG. 8D.

Each of the sub-block drive circuits S_CR, as described in FIG. 7A, may be configured to transmit operation voltages VSSL, Ver, Vpgm, and Vr which may be externally generated from an external device (e.g., a voltage generator) to a sub-block stack structure SUB corresponding thereto. Alternatively, each of the sub-block drive circuits S_CR, as described in FIG. 7B, may be configured to generate operation voltages VSSL, Ver, Vpgm, and Vr and to provide the generated operation voltages VSSL, Ver, Vpgm, and Vr to a sub-block stack structure SUB corresponding thereto.

FIGS. 9A to 14 are sectional views illustrating a method of manufacturing a semiconductor device according to an embodiment of the present disclosure. Particularly, FIGS. 9A to 14 are sectional views illustrating a method of manufacturing of the semiconductor device shown in FIG. 4A.

Figure 9A:
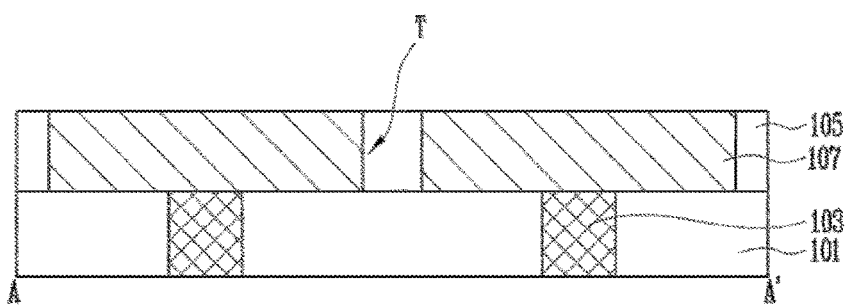
FIGS. 9A to 14 are sectional views illustrating a method of manufacturing a semiconductor device according to an embodiment of the present disclosure.
Figure 9B:
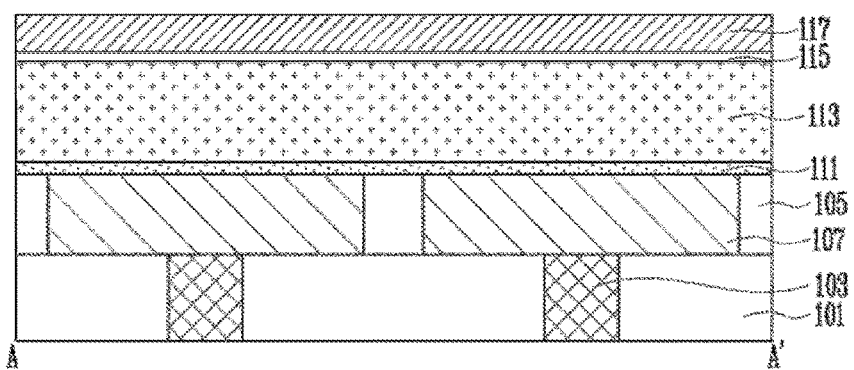
Figure 9C:
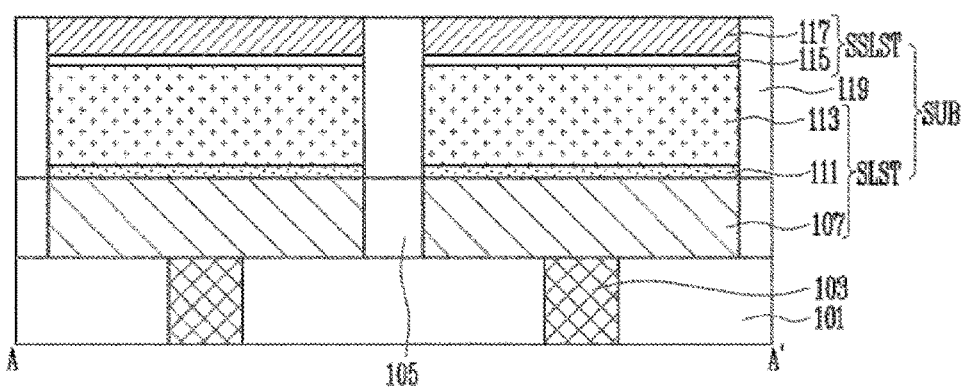

FIGS. 9A to 9C are sectional views illustrating a method of manufacturing sub-block stack structures SUB. Also, FIGS. 9A to 9C are sectional views taken along line A-A' shown in FIG. 4A.

Referring to FIG. 9A, a lower insulating layer 101 is formed over a lower structure including sub-block drive circuits (not shown) to cover the sub-block drive circuits. Subsequently, source contact plugs 103 penetrating the lower insulating layer 101 are formed. The source contact plugs 103 may be directly coupled to the sub-block drive circuits, respectively, or may be coupled to the sub-block drive circuits via routing lines (not shown) formed on the lower insulating layer 101, respectively.

After that, a first sub-insulating layer 105 is formed to cover the lower insulating layer 101 and the source contact plugs 103. Subsequently, the first sub-insulating layer 105 is etched, thereby forming source trenches T. The source trenches T expose the source contact plugs 103 therethrough, and are formed in the same pattern as sub-block stack structures. For example, in order to provide the sub-block stack structures described in FIG. 4A, the source trenches T may be arranged to be spaced apart from each other along first and second directions intersecting each other.

Subsequently, the source trenches T are filled with first source layers 107, respectively. The first source layers 107 may contact the source contact plugs 103. The first source layers 107 may include a metal such as tungsten (W) for low-resistance wiring.

Referring to FIG. 9B, a second source layer 113, a first interlayer insulating layer 115, and a source select layer 117 are sequentially stacked over the first sub-insulating layer 105 to cover the first source layers 107. Before the second source layer 113 is formed, a barrier metal layer 111 may be further formed.

The barrier metal layer 111 may include titanium (Ti), tantalum (Ta), titanium nitride (TiN), tantalum nitride (TaN), etc. The second source layer 113 may be a doped polysilicon layer including a dopant. The source select layer 117 may be a conductive layer including polysilicon, metal silicide, metal, etc.

Referring to FIG. 9C, the source select layer 117, the first interlayer insulating layer 115, the second source layer 113, and the barrier metal layer 111 are etched, thereby separating them into sub-patterns in the same shape as the first source layers 107. Accordingly, a source layer stack structure SLST is formed which includes each of the first source layer 107, the sub-patterns of the barrier metal layer 111, and the sub-patterns of the second source layer 113. Also, a source select stack structure SSLST is formed which includes each of the sub-patterns of the first interlayer insulating layer 115 and the sub-patterns of the source select layer 117. The source layer stack structure SLST and the source select stack structure SSLST constitute each of the sub-block stack structures SUB described in FIG. 4A, and may be patterned to have the layout described in FIG. 4A.

Subsequently, a second sub-insulating layer 119 filled between the sub-block stack structures SUB is formed. The second sub-insulating layer 119 is disposed on the first sub-insulating layer 105.

FIGS. 10A to 10H are sectional views illustrating a process of forming channel layers. Also, FIGS. 10A to 10H are sectional views taken along line A-A' shown in FIG. 4A.

Figure 10A:
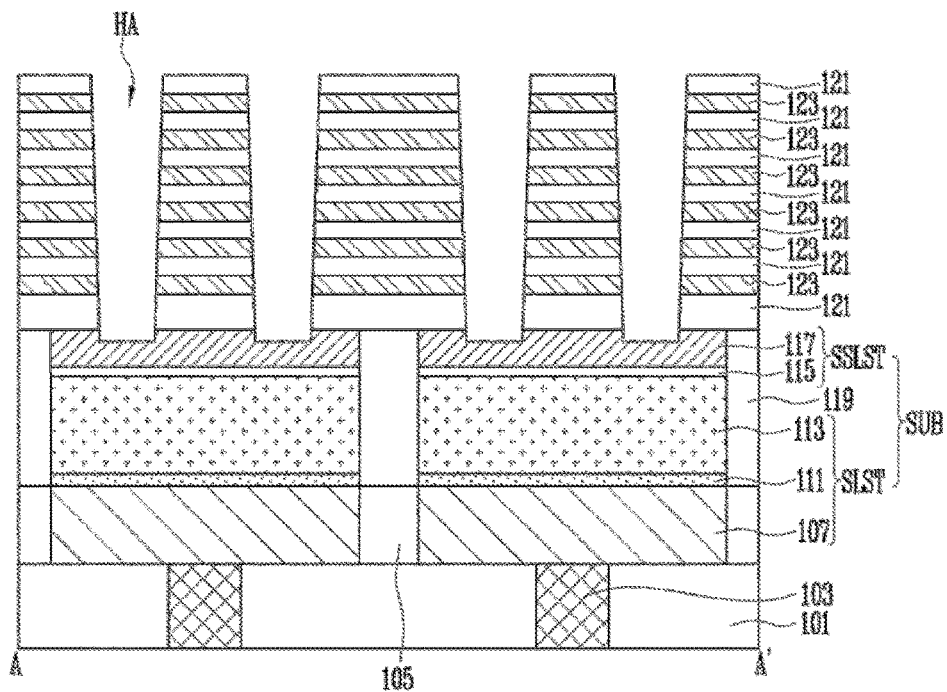

Referring to FIG. 10A, first material layers 121 and second material layers 123 are alternately stacked on the sub-block stack structures SUB and the second sub-insulating layer 119. The first material layers 121 may be formed in a region in which second and third interlayer insulating layers are to be arranged, and the second material layers 123 may be formed in a region in which word lines and a drain select line are to be arranged. The second material layers 123 are formed of a different material than the first material layers 121. For example, the first material layers 121 may be formed of an insulating material for the interlayer insulating layers, and the second material layers 123 may be formed of a conductive material for the word lines and the drain select line.

Alternatively, the first material layers 121 may be formed of an insulating material for the interlayer insulating layers, and the second material layers 123 may be formed of a sacrificial insulating material, which is used as a sacrificial material and has an etching selection ratio with respect to the first material layers 121. In this case, the first material layers 121 may be formed of a silicon oxide layer, and the second material layers 123 may be formed of a silicon nitride layer. When both the first and second material layers 121 and 123 are formed of insulating materials, it is possible to reduce the degree of difficulty of subsequent etching processes for forming holes HA and a slit.

Alternatively, the first material layers 121 may be formed of a sacrificial conductive material having an etching selection ratio with respect to the second material layers 123, and the second material layers 123 may be formed of a target conductive material for the word lines and the drain select line. In this case, the first material layers 121 may be formed of an undoped polysilicon layer, and the second material layers 123 may be formed of a doped polysilicon layer.

Hereinafter, a case where the first material layers 121 are formed of an insulating material for the interlayer insulating layers and the second material layers 123 are formed of a sacrificial insulating material is illustrated as an example, but the present disclosure is not limited thereto.

Subsequently, the first material layers 121 and the second material layers 123 are etched, thereby forming holes HA of a first type, which penetrate the first material layers 121 and the second material layers 123. The holes HA of the first type may expose the source select layer 117 therethrough. The source select layer 117 may be used as an etch stop layer when an etching process for forming the holes HA of the first type is performed, so that depths of the holes HA of the first type can be uniformly controlled.

Figure 10B:
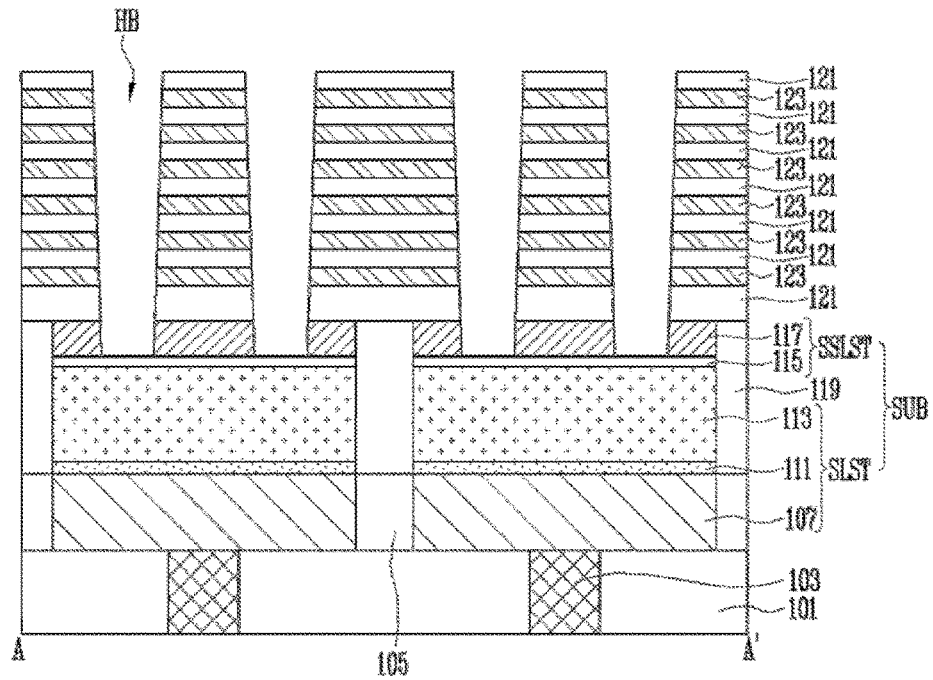

Referring to FIG. 10B, the source select layer 117 exposed through the holes HA of the first type is etched, thereby forming holes HB of a second type. The holes HB of the second type may expose the first interlayer insulating layer 115 therethrough. The first interlayer insulating layer 115 is used as an etch stop layer when an etching process for forming the holes HB of the second type is performed, so that depths of the holes HB of the second type can be uniformly controlled.

Figure 10C:
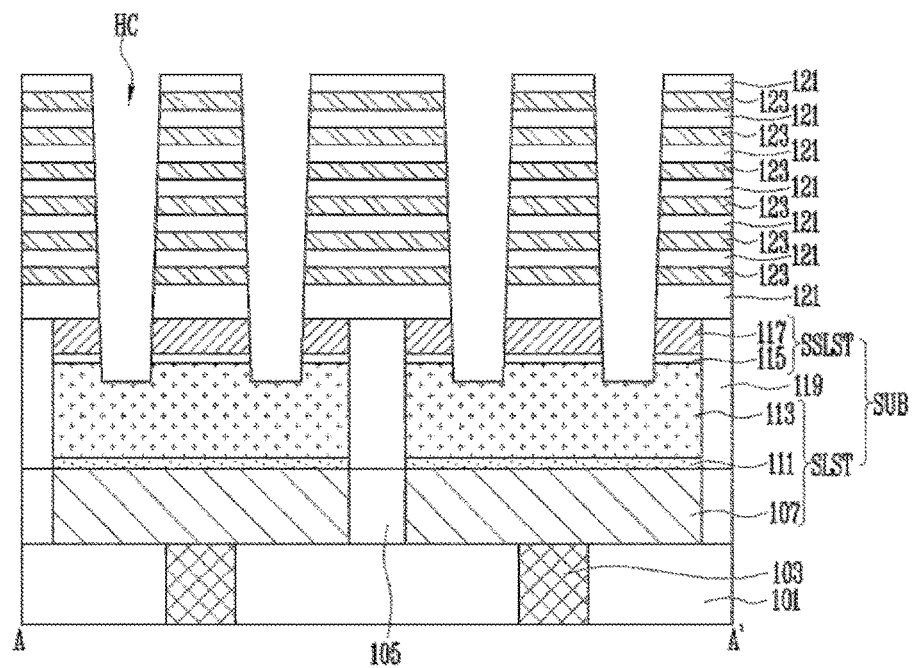

Referring to FIG. 10C, the first interlayer insulating layer 115 exposed through the holes HB of the second type is etched, thereby forming holes HC of a third type. The holes HC of the third type may extend to inside the second source layer 113. Accordingly, a portion of the second source layer 113 can be exposed through sidewalls of the holes HC of the third type.

Figure 10D:
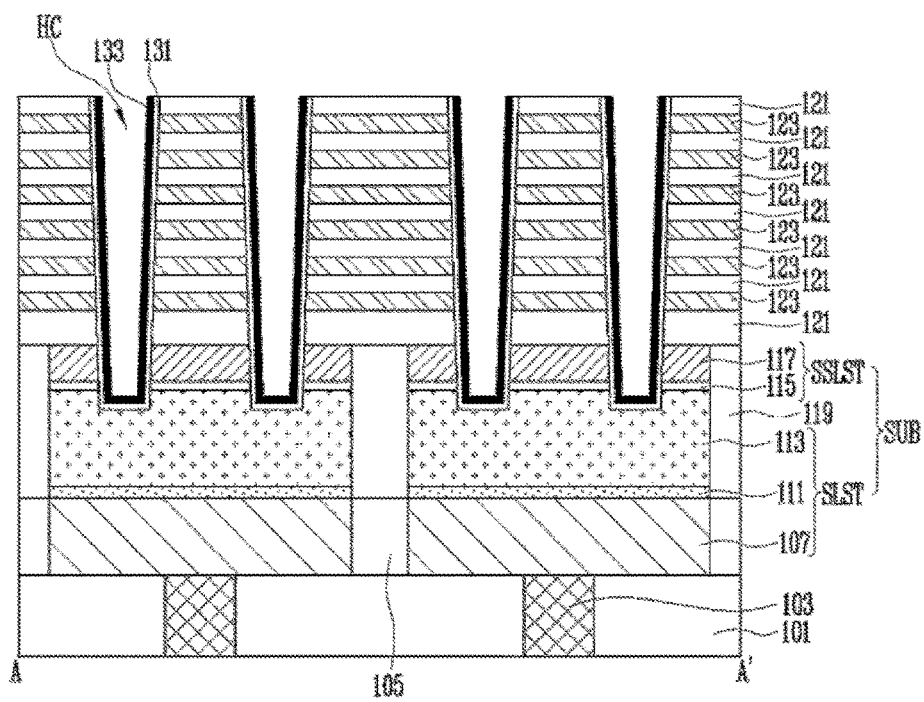

Referring to FIG. 10D, a multi-layered memory layer 131 may be formed along the surface of each of the holes HC of the third type. The multi-layered memory layer 131 may be formed by sequentially stacking a blocking insulating layer, a data storage layer, and a tunnel insulating layer. The blocking insulating layer may be formed of an insulating material by which charges can be blocked, the data storage layer may be formed of a silicon nitride layer in which charges can be trapped, and the tunnel insulating layer may be formed of a silicon oxide layer through which charges can tunnel. Alternatively, the data storage layer may include a phase change material, a ferroelectric material, a nano-dot, etc. Each of the blocking insulating layer, the data storage layer, and the tunnel insulating layer may be formed along a surface shape of each of the holes HC of the third type. After that, a protective layer 133 is formed on the multi-layered memory layer 131. The multi-layered memory layer 131 and the protective layer 133 may be planarized to be separated for each of the holes HC of the third type. The protective layer 133 may include a silicon layer.

Figure 10E:
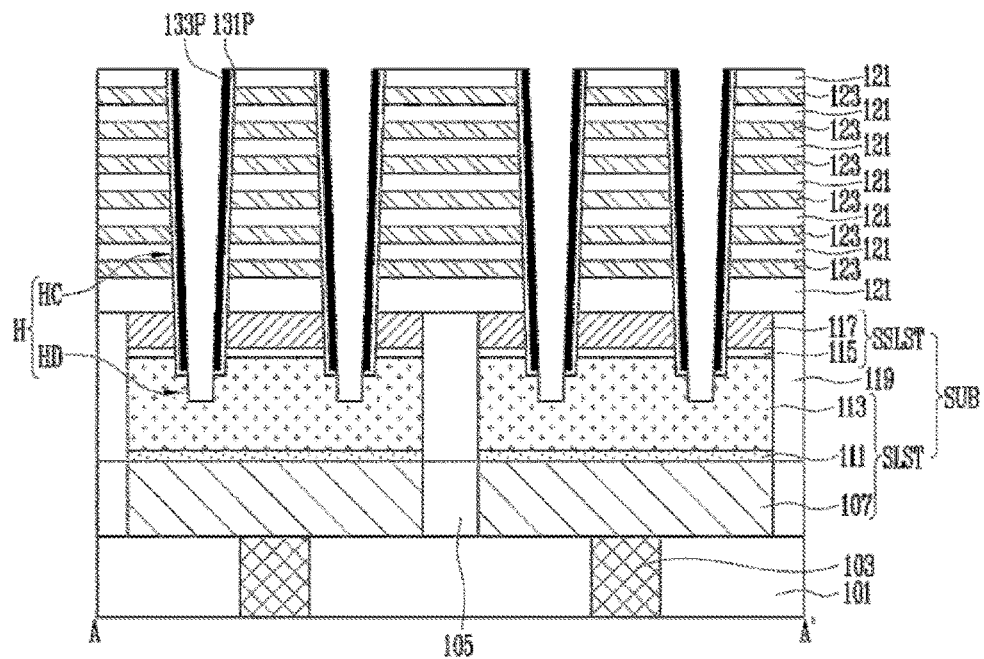

Referring to FIG. 10E, a portion of the protective layer 133 is removed through an etching process such that a partial region of the multi-layered memory layer 131 formed on a bottom surface of each of the holes HC of the third type is exposed. At this time, the etching process is controlled such that a protective layer pattern 133P can remain on the sidewall of each of the holes HC of the third type.

After that, the multi-layered memory layer 131 is etched using the protective layer pattern 133P as an etching barrier. Accordingly, the second source layer 113 can be exposed through the bottom surface of the holes HC of the third type, and a multi-layered memory layer pattern 131P can remain on the sidewall of the holes HC of the third type.

Subsequently, the second source layer 113 is etched using the protective layer pattern 133P as the etching barrier, thereby forming source grooves HD coupled to the holes HC of the third type. Hereinafter, for convenience of illustration, a coupling structure of each of the holes HC of the third type and each of the source grooves HD will be defined as a channel hole H. Sidewalls of the source grooves HD expose the second source layer 113 therethrough.

Figure 10F:
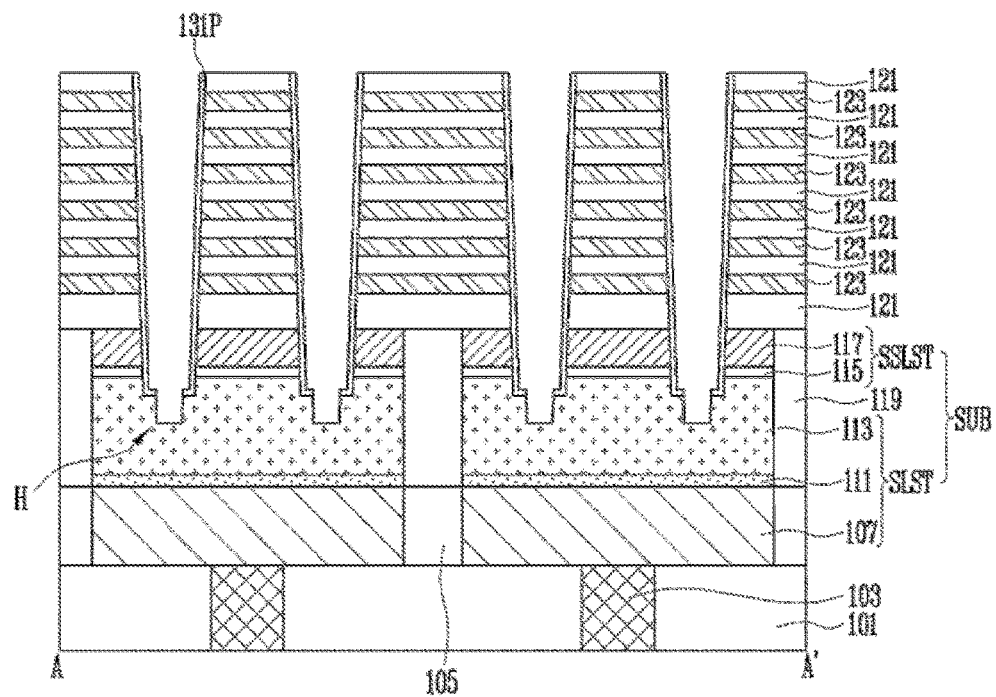

Referring to FIG. 10F, the protective layer pattern 133P is removed, thereby exposing the multi-layered memory layer pattern 131P.

Figure 10G:
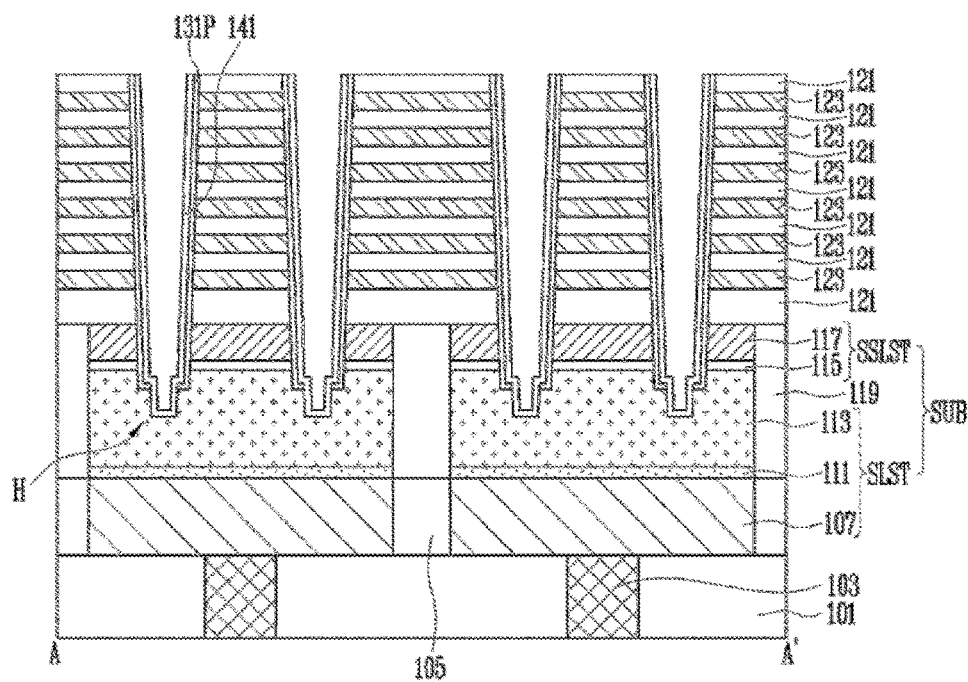

Referring to FIG. 10G, a channel layer 141 is formed on the surface of each of the channel holes H. Although not shown in this figure, the channel layer 141 may be formed when the protective layer pattern 133P shown in FIG. 10E is not removed. In this case, the protective layer pattern 133P may be used as a channel.

The channel layer 141 may be an undoped silicon layer. The channel layer 141 may contact the second source layer 113 exposed through each of the channel holes H.

Figure 10H:
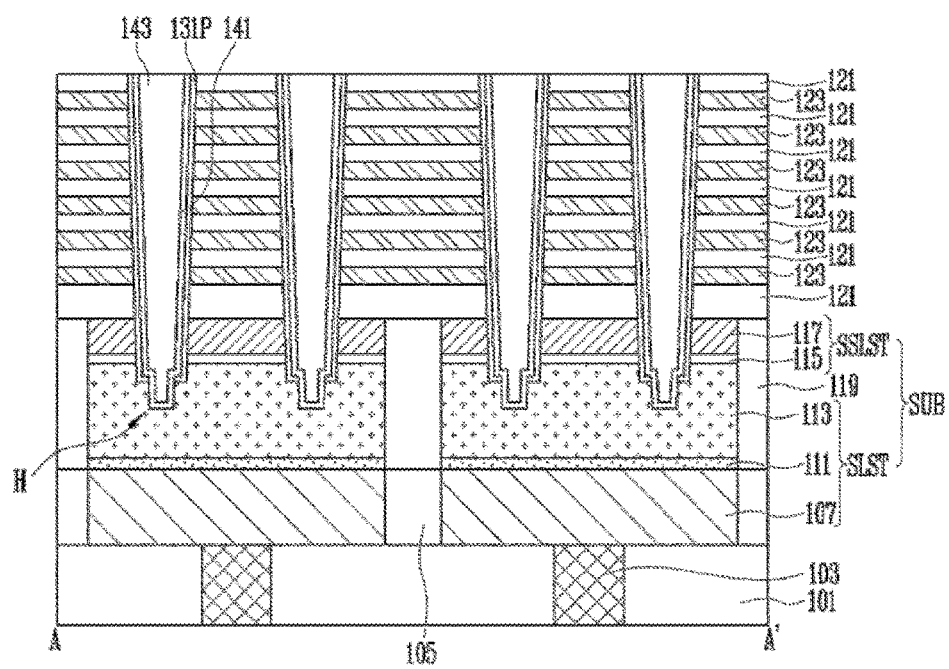

Referring to FIG. 10H, a core insulating layer 143 filled in a central region of each of the channel holes H is formed on the channel layer 141.

Figure 11A:
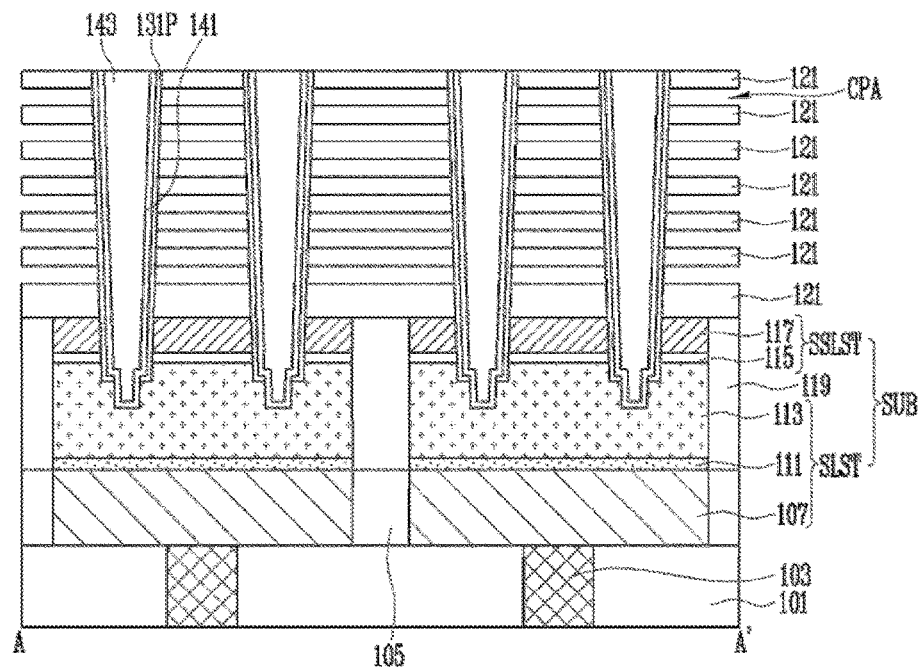
Figure 11B:
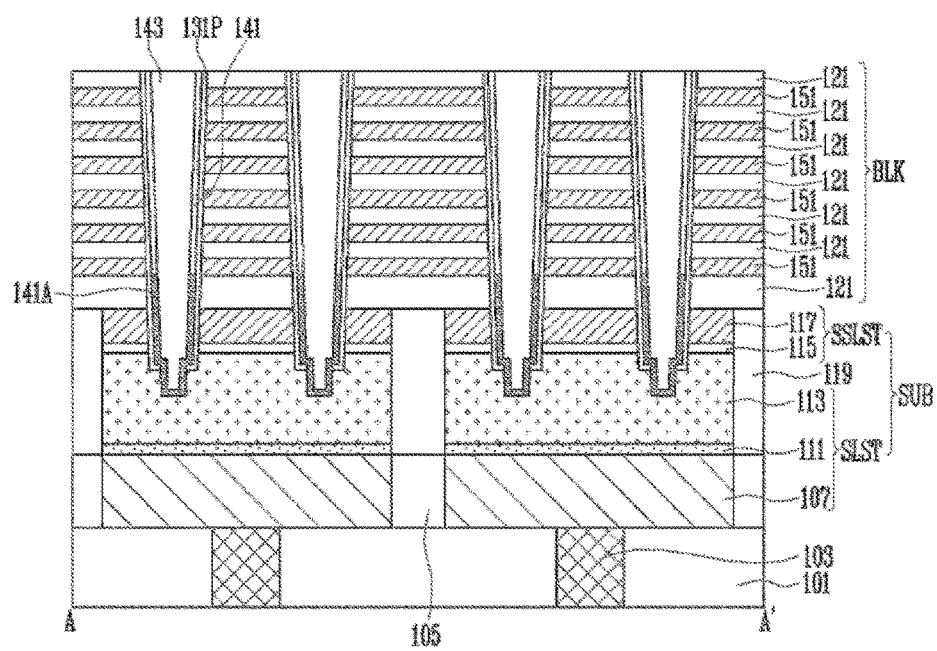
Figure 12A:
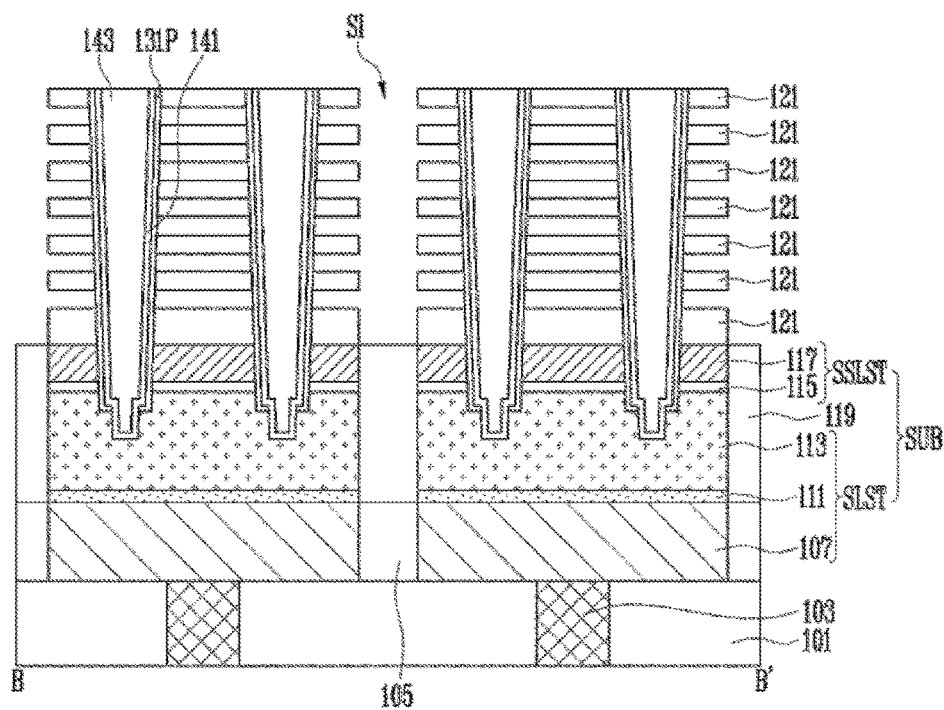
Figure 12B:
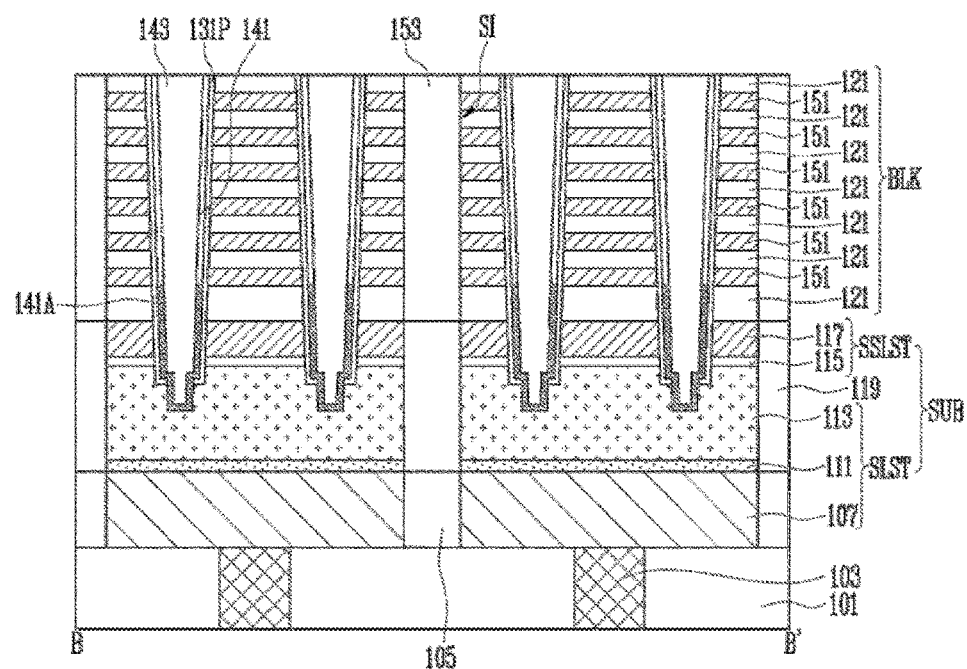

FIGS. 11A, 11B, 12A, and 12B are sectional views illustrating processes of forming a memory block stack structure. More specifically, FIGS. 11A and 11B are sectional views taken along line A-A' shown in FIG. 4A, and FIGS. 12A and 12B are sectional views taken along line B-B' shown in FIG. 4A.

Referring to FIGS. 11A and 12A, a slit SI is formed which penetrates the first material layers 121 and the second material layers 123, shown in FIG. 10H. The slit SI separates the first material layers 121 and the second material layers 123 into the same patterns as the memory block stack structures BLK0 and BLK1 shown in FIG. 4A.

When the first material layers 121 are formed as interlayer insulating layers and the second material layers 123 are formed as sacrificial insulating layers, the second material layers 123 are removed through the slit SI, thereby opening conductive regions CPA. The conductive regions CPA are defined between the first material layers 121 adjacent to each other.

Referring to FIGS. 11B and 12B, the conductive regions CPA described in FIGS. 11A and 12A are filled with conductive layers 151. The conductive layers 151 may be a metal having a lower resistance than polysilicon. For example, the conductive layers 151 may be tungsten. The conductive layers 151 may be used as word lines and a drain select line.

Memory block stack structures BLK including a structure in which the first material layers 121 for the interlayer insulating layers and the conductive layers 151 are alternately stacked, the memory block stack structures BLK being separated by the slit SI may be formed using the processes described in FIGS. 11A, 11B, 12A, and 12B.

The memory block stack structures BLK separated by the slit SI may be formed using different methods than described in FIGS. 11A, 11B, 12A, and 12B. For example, the first material layers 121 may be formed as interlayer insulating layers, and the second material layers 123 may be formed of a conductive material. In this case, although the second material layers 123 are not replaced with the conductive layers 151 after the process of forming the slit SI, memory block stack structures may be formed which are separated by the slit SI and include a structure in which the first material layers 121 for the interlayer insulating layer and the second material layers 123 formed of the conductive material are alternately stacked.

As another example, the first material layers 121 may be formed of a sacrificial conductive material, and the second material layers 123 may be formed of a target conductive material. In this case, the first material layers 121 may be replaced with insulating layers through the slit SI. Therefore, memory block stack structures may be formed which are separated by the slit SI and include a structure in which the insulating layers and the second material layers 123 formed of the conductive material are alternately stacked.

After the memory block stack structures BLK separated by the slit SI are formed using various methods as described above, the slit SI is filled with a slit insulating layer 153 as shown in FIG. 12B.

Referring to FIGS. 11B and 12B, while the conductive layers 151 are being formed, a dopant included in the second source layer 113 may be diffused into the channel layer 141. Therefore, a source junction 141A including the dopant may be formed at a lower portion of the channel layer 141. Alternatively, the source junction 141A may be formed by separately performing a dopant diffusion process using a thermal process.

Figure 13A:
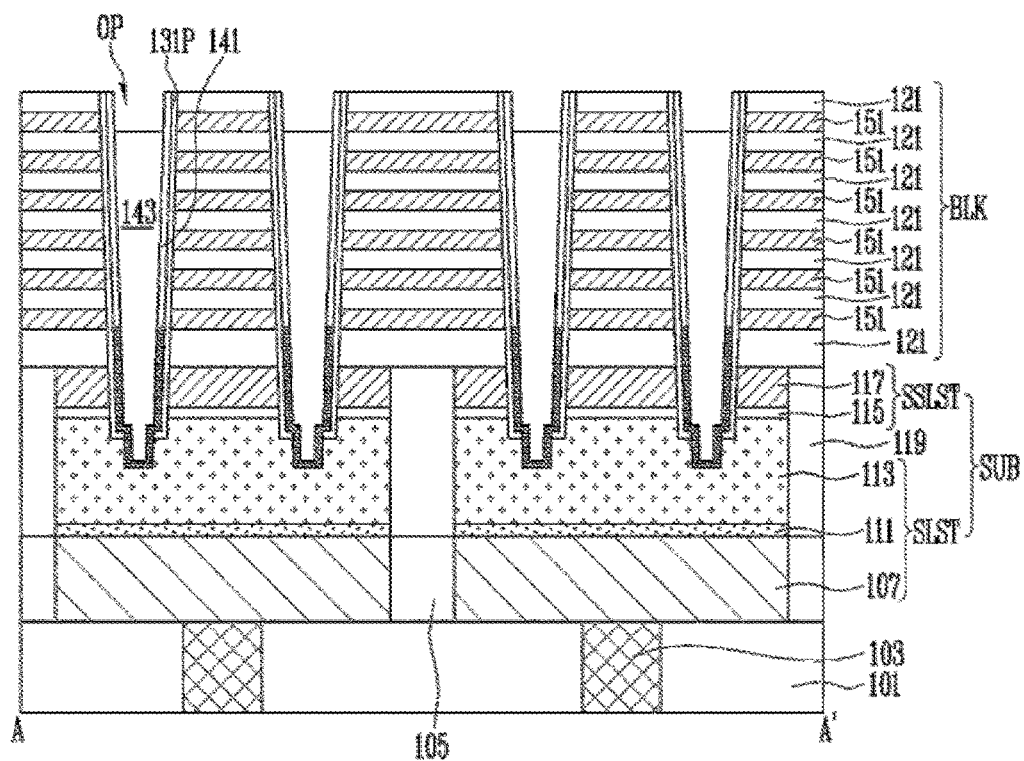
Figure 13B:
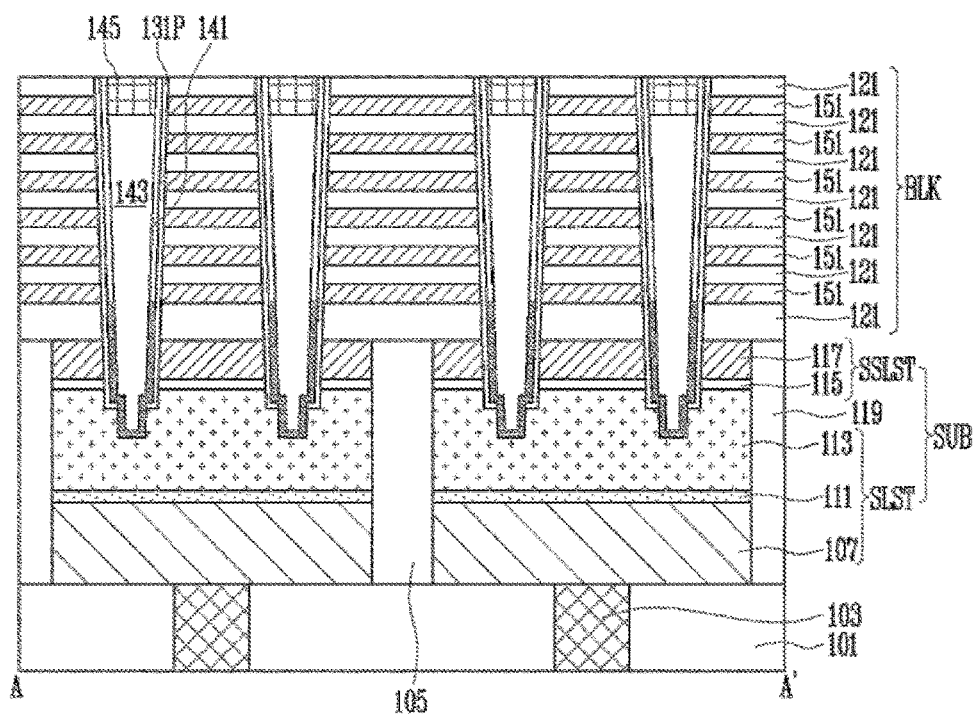
Figure 13C:
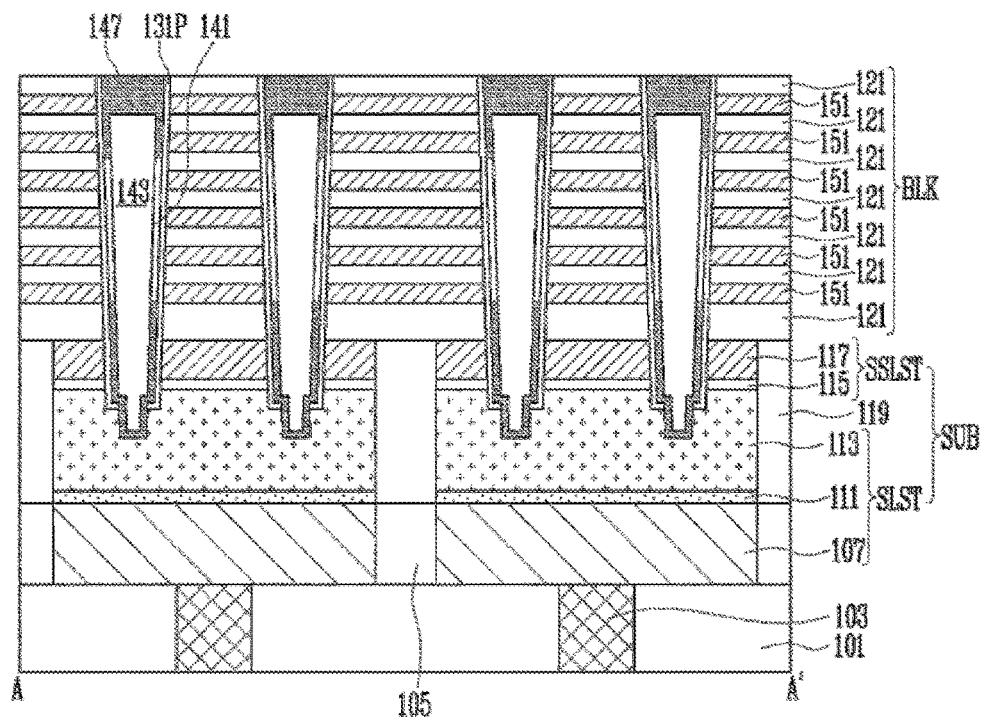

FIGS. 13A to 13C are sectional views illustrating processes of forming a drain junction. More specifically, FIGS. 13A to 13C are sectional views taken along line A-A' shown in FIG. 4A.

Referring to FIG. 13A, the core insulating layer 143 formed through the process described in FIG. 10H is etched to a partial depth, thereby defining an opening OP inside the channel layer 141.

Referring to FIG. 13B, the opening OP described in FIG. 13A may be filled with a doped layer 145. The doped layer 145 may be a doped polysilicon layer including a dopant.

Referring to FIG. 13C, laser is irradiated onto the doped layer 145 described in FIG. 13B, or a heat treatment process is performed on the doped layer 145. Accordingly, the dopant in the doped layer 145 is diffused toward an upper portion of the channel layer 141, and the doped layer 145 and the upper portion of the channel layer 141 are melted and re-crystallized, thereby forming a drain junction 147.

Figure 14:
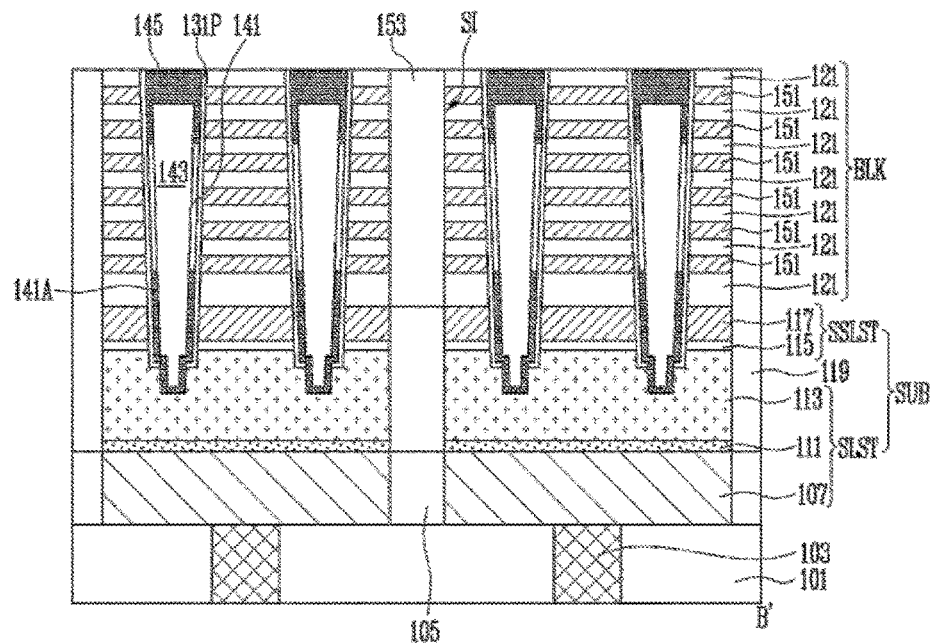

FIG. 14 is a sectional view taken along line B-B' shown in FIG. 4A after the drain junction 147 is formed. Reference numerals identical to those of FIGS. 9A to 13C among reference numerals shown in FIG. 14 designate components identical to those of FIGS. 9A to 13C.

Referring to FIG. 14, portions of the first and second sub-insulating layers 105 and 119 may overlap the slit insulating layer 153. In addition, the sub-block stack structures SUB may be separated by a small size such that each of the sub-block stack structures SUB does not overlap two or more memory block stack structures BLK.

Figure 15:
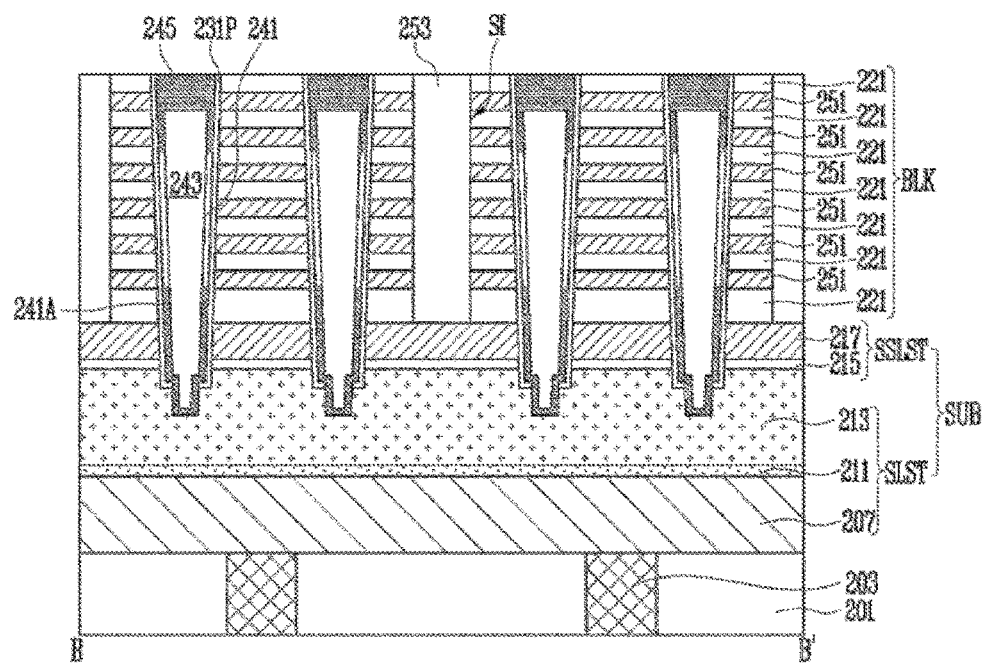
FIG. 15 is a sectional view illustrating a method of manufacturing a semiconductor device according to an embodiment of the present disclosure.

FIG. 15 is a sectional view illustrating a method of manufacturing a semiconductor device according to an embodiment of the present disclosure. Particularly, FIG. 15 is a sectional view taken along line C-C' shown in FIG. 4B. The section taken along line A-A' of the semiconductor device shown in FIG. 4B is identical to the section taken along line A-A' shown in FIG. 4A, and therefore, is omitted.

Referring to FIG. 15, a lower insulating layer 201 covering sub-block drive circuits (not shown), source contact plugs 203 penetrating the lower insulating layer 201, and a sub-block stack structure SUB disposed over the source contact plugs 203 are formed using the processes described in FIGS. 9A to 9C.

The sub-block stack structure SUB may include a source layer stack structure SLST and a source select stack structure SSLST. The source layer stack structure SLST may be formed into a stack structure of a first source layer 207, a barrier metal layer 211, and a second source layer 213. The first source layer 207 may contact the source contact plugs 203. The source select stack structure SSLST may be formed into a stack structure of a first interlayer insulating layer 215 and a source select layer 217. The first source layer 207, the barrier metal layer 211, the second source layer 213, and the source select layer 217 may be formed of materials identical to those described in FIGS. 9A to 9C.

The sub-block stack structure SUB may be patterned to have the layout described in FIG. 4B. The sub-block stack structure SUB may extend along the second direction in which line B-B' faces.

Subsequently, a channel layer 241 surrounding a core insulating layer 243, the channel layer 241 being contacted with the second source layer 213, the channel layer 241 including a sidewall surrounded by a multi-layered memory layer pattern 231P is formed using the processes described in FIGS. 10A to 10H.

After that, memory block stack structures BLK including a structure in which interlayer insulating layers 221 and conductive layers 251 are alternately stacked, the memory block stack structures BLK being separated by a slit SI may be formed using the processes described in FIGS. 11A, 11B, 12A, and 12B. Subsequently, the slit SI may be filled with a slit insulating layer 253. The slit SI and the slit insulating layer 253 may extend in a direction intersecting the sub-block stack structure SUB, and may overlap the sub-block stack structure SUB.

A dopant included in the second source layer 213 may be diffused into the channel layer 241, using a process of forming the conductive layers 251 or a separate thermal process for diffusing the dopant. Accordingly, a source junction 241A including the dopant is formed at a lower portion of the channel layer 241.

After that, a drain junction 245 is formed at an upper portion of the channel layer 241, using the processes described in FIGS. 13A to 13C.

Figure 16:
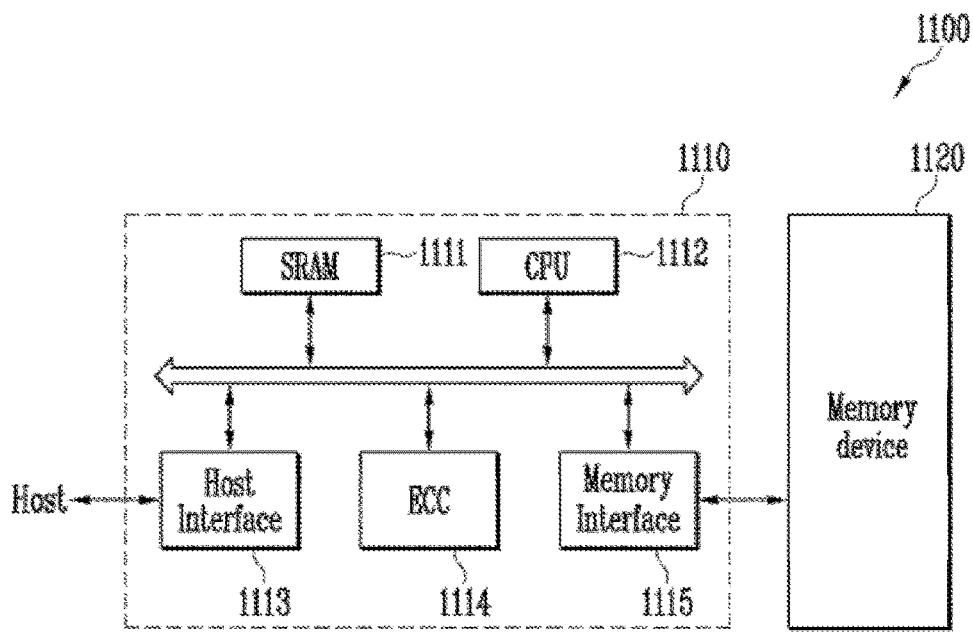
FIG. 16 is a block diagram illustrating a configuration of a memory system according to an embodiment of the present disclosure.

FIG. 16 is a block diagram illustrating a configuration of a memory system according to an embodiment of the present disclosure.

Referring to FIG. 16, the memory system 1100 according to the embodiment of the present disclosure includes a memory device 1120 and a memory controller 1110.

The memory device 1120 may include structures described in FIGS. 3 to 8D. For example, the memory device 1120 may include memory block stack structures including a stack structure of word lines, the memory block stack structures being separated into memory block units, and sub-block stack structures disposed under the memory block stack structures, the sub-block stack structures including source layers, the sub-block stack structures being separated into sub-block units. In addition, the memory device 1120 may further include sub-block drive circuits capable of driving the sub-block stack structures into the sub-block units further segmented than the memory blocks, thereby individually controlling the sub-block stack structures.

The memory device 1120 may be a multi-chip package formed of a plurality of flash memory chips.

The memory controller 1110 is configured to control the memory device 1120, and may include a static random access memory (SRAM) 1111, a CPU 1112, a host interface 1113, an error correction code (ECC) 1114, and a memory interface 1115. The SRAM 1111 is used as an operation memory of the CPU 1112, the CPU 1112 performs the general control operations for data exchange of the memory controller 1110, and the host interface 1113 includes a data exchange protocol for a host coupled to the memory system 1100. The ECC 1114 detects and corrects an error included in a data read from the memory device 1120, and the memory interface 1115 interfaces with the memory device 1120. In addition, the memory controller 1110 may further include a read only memory (ROM) for storing code data for interfacing with the host, and the like.

The memory system 1100 configured as described above may be a memory card or a solid state disk (SSD), in which the memory device 1120 is combined with the controller 1110. For example, when the memory system 1100 is an SSD, the memory controller 1100 may communicated with the outside (e.g., the host) through one among various interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, and an integrated drive electronics (IDE) protocol.

Figure 17:
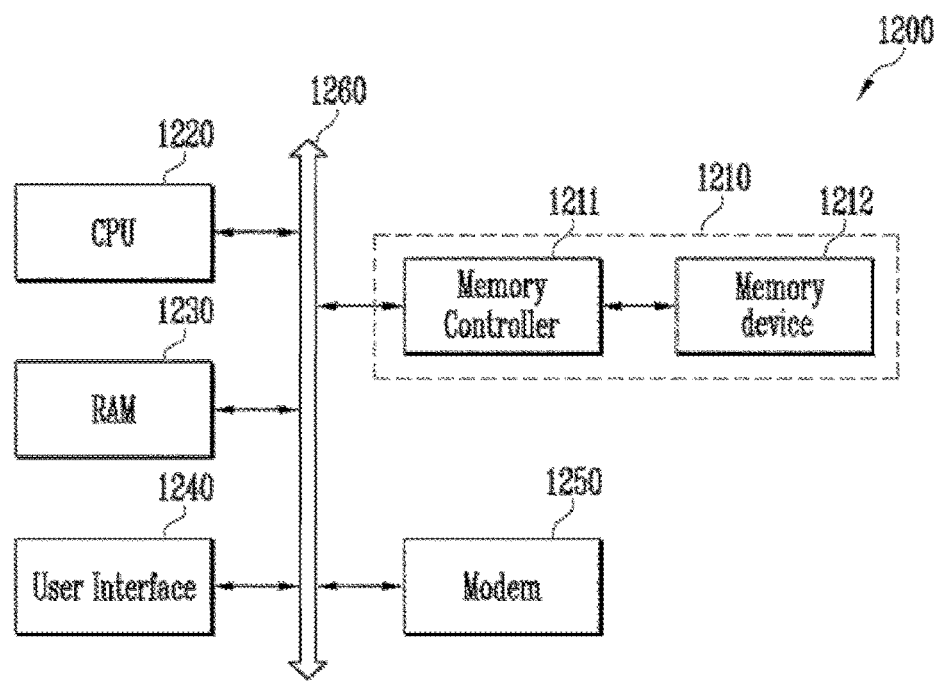
FIG. 17 is a block diagram illustrating a configuration of a computing system according to an embodiment of the present disclosure.

FIG. 17 is a block diagram illustrating a configuration of a computing system according to an embodiment of the present disclosure.

Referring to FIG. 17, the computing system 1200 according to the embodiment of the present disclosure may include a CPU 1220, a random access memory (RAM) 1230, a user interface 1240, a modem 1250, and a memory system 1210, which are electrically coupled to a system bus 1260. When the computing system 1200 is a mobile device, a battery for supplying an operation voltage to the computing system 1200 may be further included, and an application chip set, a camera image processor (CIS), a mobile D-RAM, and the like may be further included.

The memory system 1210, as described with reference to FIG. 16, may be configured with a memory device 1212 and a memory controller 1211.

According to the present disclosure, source layers are divided into sub-blocks smaller than memory blocks, thereby individually controlling the source layers in sub-block units. Accordingly, an operation of each memory block can be controlled in sub-block units. Thus, although the capacity of the memory block is increased, the operation of the memory block can be controlled in sub-block units, thereby improving the operation efficiency and reliability of the memory block.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:
1. A semiconductor device comprising:
sub-block stack structures respectively including source layers and source select layers, the source select layers coupled to gates of source select transistors, where the sub-block stack structures are disposed to be spaced apart from each other;
a memory block stack structure including word lines stacked over the sub-block stack structures, the word lines being coupled to memory cells, the memory block stack structure to overlap the sub-block stack structures; and
channel layers respectively coupled to the source layers by penetrating the memory block stack structure,
wherein the source select layers are electrically separated from each other in an extending direction of the word lines.
2. The semiconductor device of claim 1, further comprising sub-block drive circuits individually providing operation voltages to the sub-block stack structures.
3. The semiconductor device of claim 2, wherein the sub-block drive circuits are disposed under the sub-block stack structures to respectively overlap the sub-block stack structures.
4. The semiconductor device of claim 2, wherein the sub-block drive circuits do not overlap the sub-block stack structures and the memory block stack structure.

5. The semiconductor device of claim 2, wherein the sub-block drive circuits generate the operation voltages and provide the generated operation voltages to the respective sub-block stack structures.

6. The semiconductor device of claim 2, wherein the sub-block drive circuits transmit externally generated operation voltages generated to the respective sub-block stack structures.

7. The semiconductor device of claim 1, wherein the source select layers are respectively disposed over the source layers, the source select layers being penetrated by the channel layers.

8. The semiconductor device of claim 1, further comprising multi-layered memory layers disposed between the source select layers and the channel layers to respectively surround the channel layers, the multi-layered memory layers extending along sidewalls of the memory block stack structure, facing the channel layers.

9. The semiconductor device of claim 1, wherein each of the sub-block stack structures is formed to have a narrower area than the memory block stack structure.

10. The semiconductor device of claim 1, wherein the memory block stack structure includes a drain select line disposed on the word lines to be coupled to drain select transistors, the drain select line being penetrated by the channel layers.

11. A semiconductor device comprising:
sub-block stack structures disposed to be spaced apart from each other along a first direction, the sub-block stack structures respectively including source layers and source select layers extending along a second direction intersecting the first direction, the source select layers coupled to gates of source select transistors;
memory block stack structures extending along the first direction to overlap the sub-blocks stack structures, the memory block stack structures being disposed to be spaced apart from each other along the second direction, the memory block stack structures respectively including word lines stacked over the sub-block stack structures, the word lines being coupled to memory cells; and
channel layers respectively coupled to the source layers by penetrating the memory block stack structures,
wherein each of the word lines and each of the sub-block stack structures cross each other so that the source select layers are electrically separated from each other in an extending direction of the word lines.

12. The semiconductor device of claim 11, further comprising sub-block drive circuits individually providing operation voltages to the sub-block stack structures.

13. The semiconductor device of claim 12, wherein the sub-block drive circuits are disposed under the sub-block stack structures to respectively overlap the sub-block stack structures.

14. The semiconductor device of claim 12, wherein the sub-block drive circuits do not overlap the sub-block stack structures and the memory block stack structures.

15. The semiconductor device of claim 12, wherein the sub-block drive circuits generate the operation voltages and provide generated the operation voltages to the respective sub-block stack structures.

16. The semiconductor device of claim 12, wherein the sub-block drive circuits transmit externally generated operation voltages to the respective sub-block stack structures.

17. The semiconductor device of claim 11, wherein the source select layers are respectively disposed over the source layers, the source select layers being penetrated by the channel layers.

18. The semiconductor device of claim 11, further comprising multi-layered memory layers disposed between the source select layers and the channel layers to respectively surround the channel layers, the multi-layered memory layers extending along sidewalls of the memory block stack structures, facing the channel layers.

19. The semiconductor device of claim 11, wherein the memory block stack structures respectively include drain select lines disposed on the word lines to be coupled to drain select transistors, the drain select lines being penetrated by the channel layers.

20. The semiconductor device of claim 11, further comprising:
sub-block drive circuits individually providing operation voltages to the sub-block stack structures; and
a word line drive circuit individually providing memory block operation voltages to the memory block stack structures.

* * * * *